United States Patent [19]

Ross

[11] Patent Number: 4,872,825
[45] Date of Patent: Oct. 10, 1989

[54] METHOD AND APPARATUS FOR MAKING ENCAPSULATED ELECTRONIC CIRCUIT DEVICES

[76] Inventor: Milton I. Ross, 400 College Ave., Haverford, Pa. 19041

[21] Appl. No.: 72,510

[22] Filed: Jul. 13, 1987

Related U.S. Application Data

[63] Continuation-in-part of Ser. No. 613,172, May 23, 1984, Pat. No. 4,680,617.

[51] Int. Cl.[4] .................... B29C 43/18; B29C 43/20; B29C 43/34
[52] U.S. Cl. ............................... 425/117; 425/126.1; 425/127; 425/346; 425/397
[58] Field of Search ............ 425/116, 117, 122, 126.1, 425/127, 397, 346; 264/272.14, 272.17, 257, 258; 249/83, 85, 78, 79, 81

[56] References Cited

U.S. PATENT DOCUMENTS

| | | | |
|---|---|---|---|
| 1,497,449 | 6/1924 | Kempton | 361/324 |
| 1,871,492 | 8/1932 | Brennecke | 264/272.18 |
| 1,998,827 | 4/1935 | Worrel et al. | 174/52.2 |
| 2,119,744 | 6/1938 | Heyman | 361/310 |
| 2,634,315 | 4/1953 | Allison et al. | 361/330 |
| 2,696,577 | 12/1954 | Smith | 364/321 |
| 3,118,016 | 1/1964 | Stephenson, Jr. | 174/685 |
| 3,341,649 | 9/1967 | James | 174/52.1 |
| 3,352,415 | 9/1967 | Seeley et al. | 206/465 |
| 3,381,080 | 4/1962 | Stelmak | 174/52.2 |
| 3,404,319 | 10/1968 | Tsuji et al. | 357/80 |
| 3,431,473 | 3/1969 | Cormier et al. | 361/301 |
| 3,436,606 | 4/1969 | Reed et al. | 357/74 |
| 3,537,175 | 10/1970 | St. Clair et al. | 29/827 |
| 3,634,600 | 1/1972 | Griffin | 174/52.4 |
| 3,639,975 | 2/1972 | Tefft | 437/213 |
| 3,651,861 | 3/1972 | Deuring | 249/79 |
| 3,659,821 | 5/1972 | Sakamoto et al. | 264/272.17 |
| 3,676,748 | 7/1972 | Kobayashi et al. | 361/421 |
| 3,684,616 | 8/1972 | Wright et al. | 156/307.5 |
| 3,727,305 | 4/1973 | Cooper, Jr. | 29/832 |
| 3,768,991 | 10/1973 | Rogers | 65/36 |

(List continued on next page.)

FOREIGN PATENT DOCUMENTS

| | | |
|---|---|---|
| 0122687 | 10/1984 | European Pat. Off. . |
| 0133600 | 2/1985 | European Pat. Off. . |
| 0143656 | 12/1978 | Japan ........................ 264/272.17 |
| 0007322 | 1/1983 | Japan ........................ 264/272.17 |
| 2083116 | 4/1987 | Japan ........................ 425/121 |
| 2207615 | 9/1987 | Japan ........................ 249/78 |

OTHER PUBLICATIONS

"Encapsulation of semi-conductor devices" by Robert K. Rosler, *Plastics Design Forum Focus Issue*, Apr., 1981, pp. 49-52.

(List continued on next page.)

*Primary Examiner*—Willard Hoag
*Attorney, Agent, or Firm*—Cushman, Darby & Cushman

[57] ABSTRACT

Encapsulated electronic circuit devices as well as methods and molding apparatus for making same are disclosed. For example, an integrated circuit "die" (or "chip") and the lead frame (or frames) to which it is physically affixed and electrically connected are positioned in a mold between stacks of resin impregnated fibrous layers of predetermined shape and size. The layers are then compressed under heat and pressure causing them to fuse together about the die and its lead frame(s). This forms a laminated protective sealed encapsulation for the die and adjacent portions of the lead frame(s), without causing undue damage to the delicate lead wires electrically connecting the die to the lead frame. Such multiple laminated layers of resin and fibers, which preferably include woven glass cloth or similar materials, provide a strong, resilient integrated circuit chip "carrier" (of either the "leaded" or "leadless" variety) which may conveniently include multiple lead frames, heat conductive members, strengthening members and the like. A window may be provided in the layers to provide a space for the chip. Also, metallic layers may also be provided to enhance performance of the package.

14 Claims, 9 Drawing Sheets

U.S. PATENT DOCUMENTS

| | | | |
|---|---|---|---|
| 3,778,685 | 12/1973 | Kennedy | 357/69 |
| 3,849,383 | 11/1974 | Fetscher et al. | 264/272.17 |
| 3,864,798 | 2/1975 | Utner | 29/25.42 |
| 3,918,148 | 10/1975 | Magdo et al. | 437/209 |
| 3,943,623 | 3/1976 | Mitzutani et al. | 437/217 |
| 3,999,285 | 12/1976 | Lewis et al. | 437/217 |
| 4,044,984 | 8/1977 | Shimizu et al. | 425/116 |
| 4,132,856 | 1/1979 | Hutchison | 174/52.2 |
| 4,139,859 | 2/1979 | Lewis | 357/72 |
| 4,332,537 | 6/1982 | Slepcevic | 425/127 |
| 4,374,080 | 2/1983 | Schroeder | 264/272.17 |
| 4,380,115 | 4/1983 | Pomante | 437/213 |
| 4,381,602 | 5/1983 | McIver | 29/848 |
| 4,386,463 | 6/1983 | McLaughlin | 29/827 |
| 4,442,056 | 4/1984 | Slepcevic | 264/272.17 |
| 4,511,317 | 4/1985 | Bandoh | 425/116 |
| 4,522,667 | 6/1985 | Hanson et al. | 156/182 |

OTHER PUBLICATIONS

"Plastic encapsulated IC: A reliability evaluation", by C. N. Bailey, *Electronic Packaging and Production*, June, 1978, pp. 129–134.

"Advanced Composites Aid Performance, Assembly" by Waterbury, *Assembly Engineering*, July, 1983, p. 26.

"P.C. Laminate Materials" by D. Erickson, *Electronic Packaging and Production*, Dec., 1980, p. 47.

Product Information from American Cyanamid Company–Cyron 5150, July, 1981.

Product Information from American Cyanamid Company–Cyron 5105.

"Leaded Chip Carriers to Predominate", *Technical Review, Electronics Weekly*, Feb. 23, 1983.

"Assessments of Micro-packaged Integrated Circuits in High Reliability Applications" by N. Sinnadurai, and D. Roberts, *Micro-Electronics Journal*, vol. 14, No. 2 (1983), p. 5.

"Integrated Circuit Package Selection: Pin Grid array vs Chip Carriers", by Danieal I. Amey, *Electronic Packaging and Production*, Jan. 19, 1982, p. 262.

*Joint Electron Device Solid State Products Engineering Counsel*, committee correspondence, subject: CHIP Carrier Definition, May 21, 1981.

"New Chip Carrier Package Concepts" by John W. Balde, Daniel I. Amey, *Computer*, Dec. 19, 1977, p. 58.

"Growing Pin Count is Forcing LSI Package Changes" by Jerry Lyman, *Electronics*, March 17, 1977, p. 81.

"Ceramic Chip Carrier–The New Standard in Packaging?" by M. L. Burch and B. M. Hargis, proceedings *National Electronics Package and Production Conference*, NEPCON, (1977), p. 43.

Patent Abstracts of Japan, vol. 5, No. 176 (E-81) [848], Nov. 12, 1981.

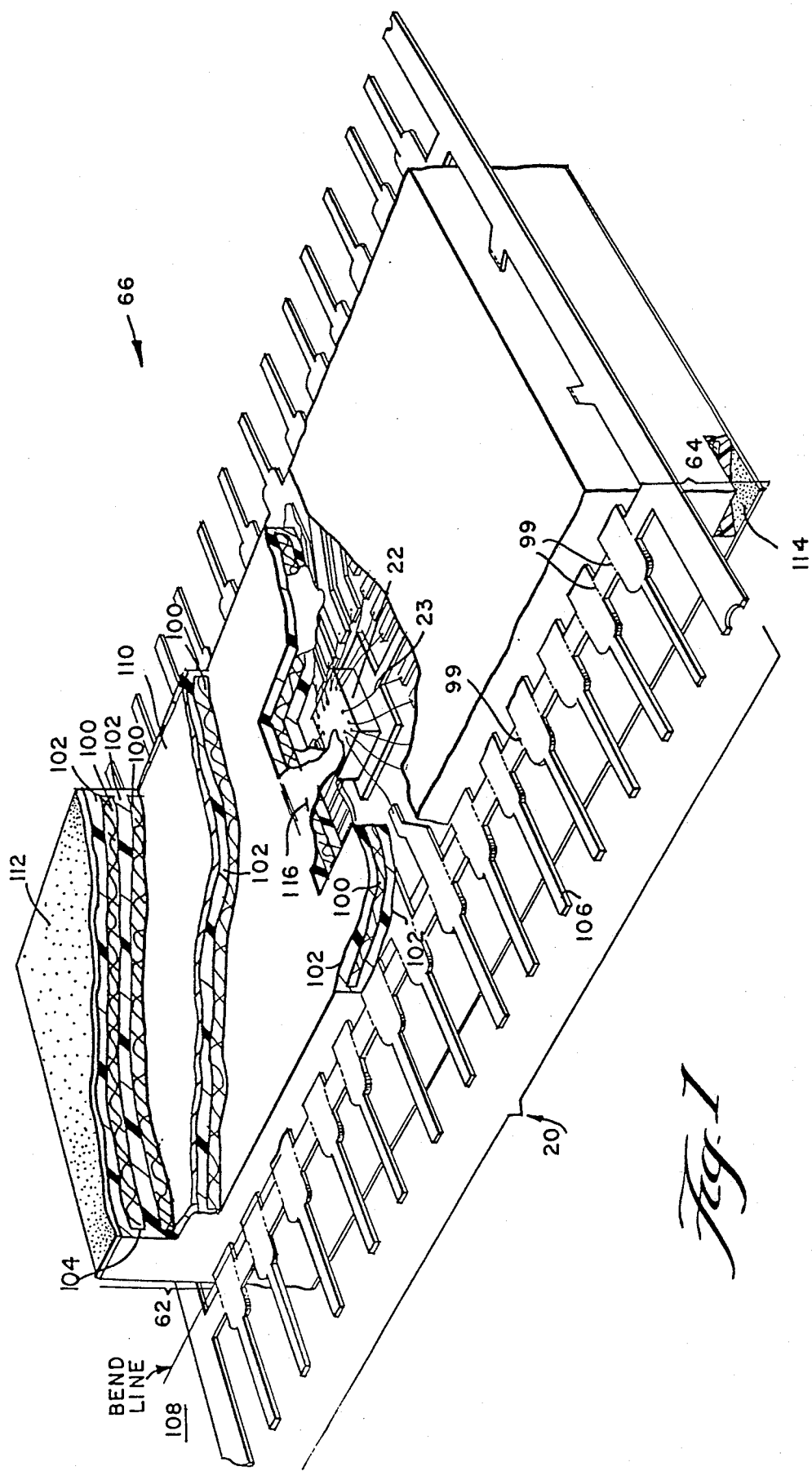

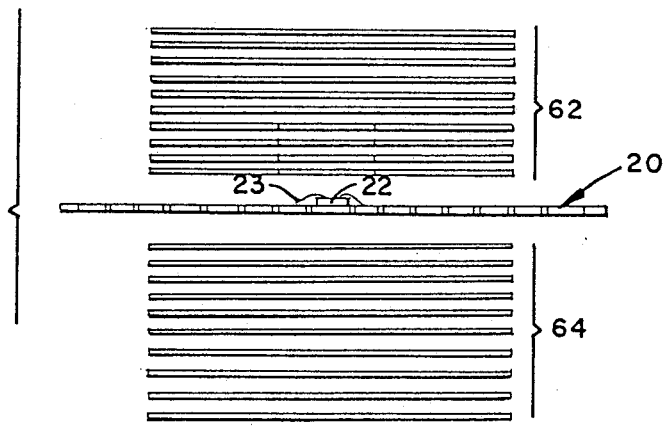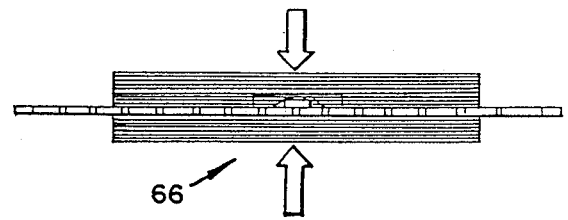

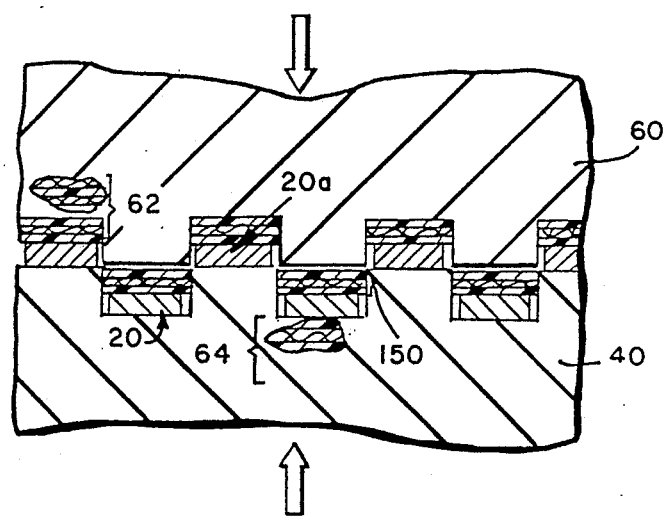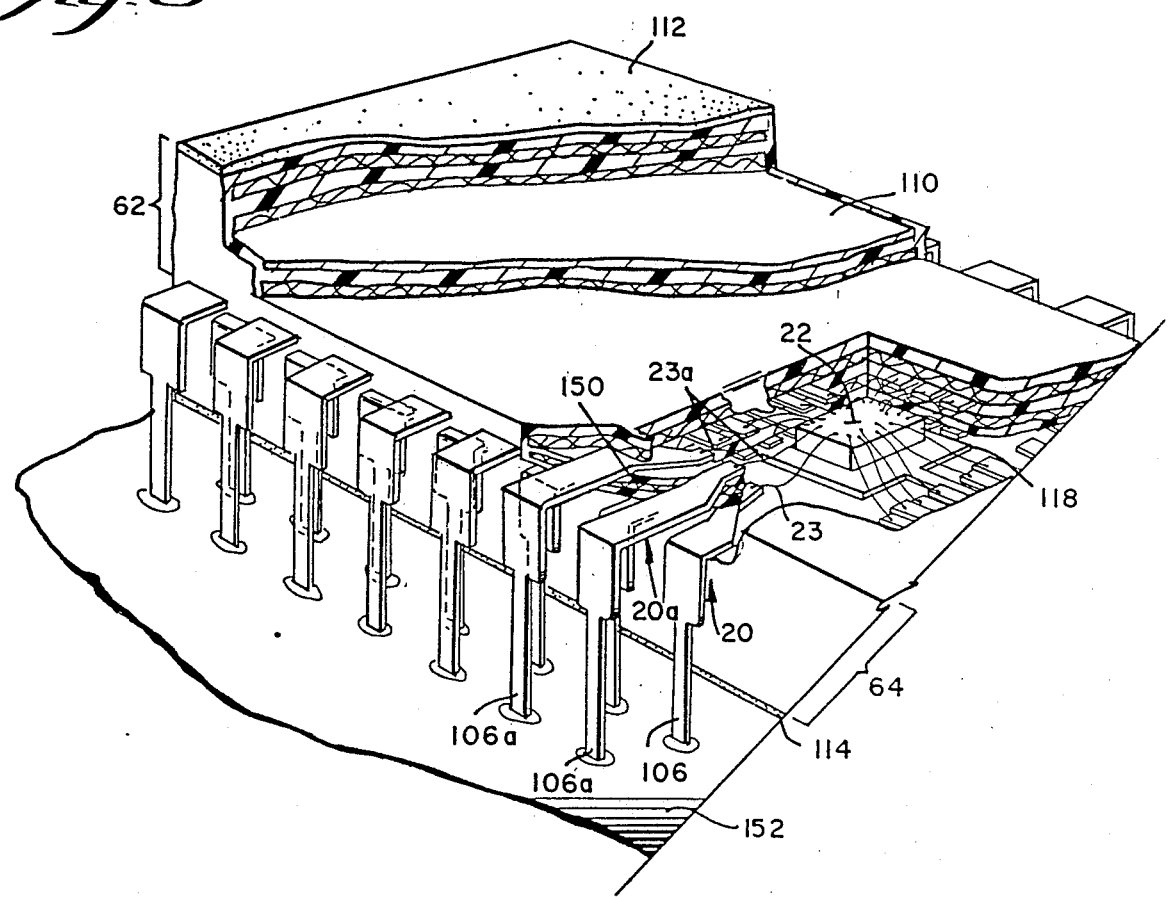

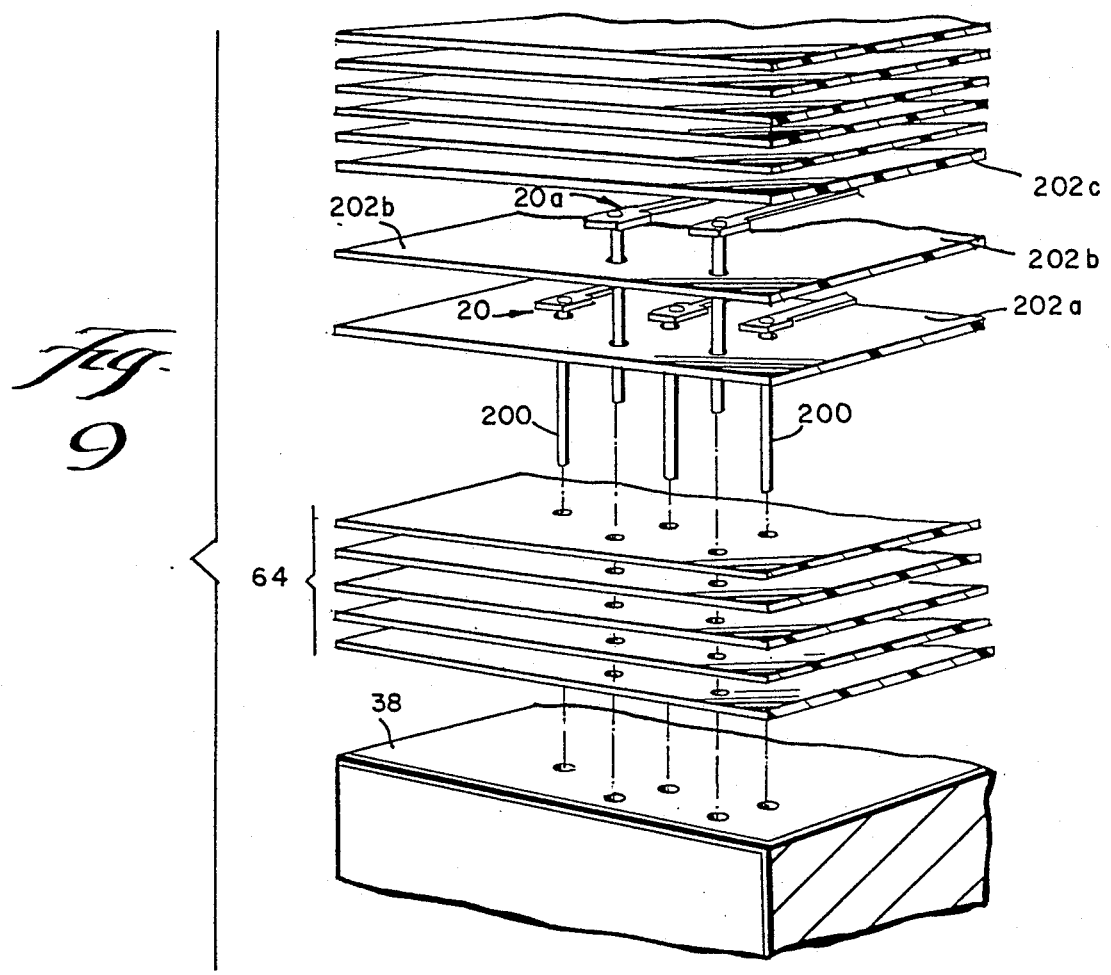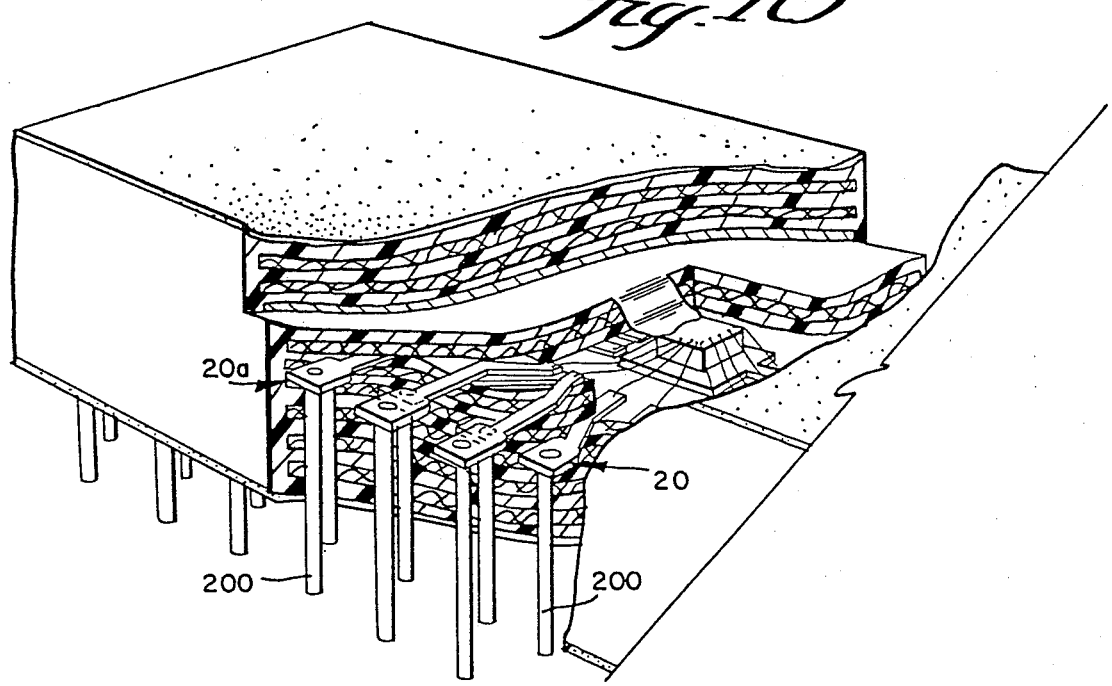

METHOD AND APPARATUS FOR MAKING ENCAPSULATED ELECTRONIC CIRCUIT DEVICES

This is a continuation in part of my earlier U.S. application Ser. No. 613,172, filed May 23, 1984, now U.S. Pat. No. 4,680,617.

BACKGROUND OF THE INVENTION

The invention relates generally to protectively sealed (plastic encapsulated) electronic circuit devices and to methods and apparatuses for forming the same. Although not limited thereto, the present invention is particularly suited to the provision of encapsulating "carriers" for integrated circuits sometimes referred to as semi-conductor "dies" or "chips" (i.e., the silicon or other semiconductive wafer itself).

In the manufacture of semi-conductor devices such as integrated circuits or semi-conductor chips, the circuitry is carried by a tiny silicon wafer or "chip". It is essential that the chip be packaged so as to protect it from the damaging effects of dust, moisture, static electricity, excessive temperature and other environmental dangers. At the same time it is necessary to provide a suitable number of electrical "leads" extending from the chip circuitry to electrical contact points external to the package. If the externally accessible leads are compliant beam leads or the like, the carrier is often said to be "leaded". If the externally accessible leads are rigidly affixed to the external carrier body, the carrier is often said to be "leadless". Such protective encapsulating structures are often referred to as chip "carriers" although other terms such as "package" or "device" have also sometimes been employed.

The two predominant types of carriers for such semiconductor chips to date have been various types of ceramic carriers and various types of plastic encapsulated carriers. Of the two, ceramic carriers universally have been deemed to provide superior protection for integrated circuitry and have been highly preferred for critical end uses, such as space or military hardware. However, the considerable difference between thermal coefficients of expansion for ceramic and the usual epoxy-based printed circuit board (to which they typically become physically affixed) often presents a considerable reliability problem. The ceramic carrier and/or the printed circuit board undergo considerable mechanical stresses as large temperature changes are encountered—especially when so-called "leadless" chip carriers are involved (i.e., where non-resilient contact pads on the carrier are soldered to mated contact pads on the printed circuit board) as typically may be the case for ceramic carriers. In less critical applications, molded plastic carriers have been preferred because they combine much lower production cost with a lower level of protection that has been tolerated by the industry because of the savings achieved by the low cost, high volume production methods associated with the use of plastic packaging. Plastic carriers also have a thermal coefficient of expansion closely approximating that of the usual printed circuit board and are thus desirable for that reason as well.

In the present manufacture of plastic encapsulated electronic circuit devices such as integrated circuits, it is common practice to provide planar metallic lead frames initially connected together in continuous strip form. The interconnecting framework is sometimes called a "dam" because it tends to limit undesirable flow of plastic back along the leads. The strip has central chip support areas spaced along its length and a plurality of individual beam leads extending outwardly (e.g., lengthwise and transversely of the strip) from points adjacent each such support area to the outer perimeter of the strip. The beam leads are initially supported by an integral "frame" interconnecting them together in a plane as a unitary mechanical structure. With semiconductor chips thus supported, the ends of electrical wires are typically bonded to the various leads on the lead frame (usually 14 to 28 or more) and to the respective appropriate connector pads on each chip. After this has been done, the strip is then placed in a mold having a cavity for each chip and a suitable thermosetting plastic encapsulating material is forced in its viscous liquid flowable state through a mold runner system into the mold cavities. The plastic thus encapsulates the chip in each cavity, a portion of the beam leads emanating therefrom and the entirety of the bonded wire connections running between the beam leads and the chip.

After encapsulation, the leads of the lead frame are "singularized" by cutting away the "dam" portions of the integral frame structure and leaving individual beam leads extending from the sides of the plastic carrier. These beam leads are typically then bent downwardly at 90° for mating with solder or other electrical connection holes or sockets in a printed circuit board. The encapsulated end products are generally referred to as packaged integrated circuits or, more simply, as "integrated circuits" or as an "IC" or even as a "chip". An example of such a plastic encapsulated IC carrier is the well known "dual-inline-package" or "DIP".

Regardless of the particular number of devices to be encapsulated at any one time, typical present day molds include pairs of heated mold members. One of the mold members is provided with a main injection opening which communicates with relatively large feed runners that extend along the lengths of the strips, with relatively small gate runners branching from the feed runners and extending to each cavity. Then, with the lead frame positioned between the mold members so that portions to be encapsulated are in registration with respective mold cavities, a suitable preheated plastic, in viscous liquid form, is injected under pressure through the main opening to fill the feed runners, gates and finally the mold cavities.

After the plastic has cured, the mold members are separated and the strips, with the encapsulated portions thereon, are removed from the mold. Ejection pins are provided on at least one of the mold members to engage the encapsulated devices and force them out of the mold cavities during mold separation. The lead frames are then "singularized" and bent for eventual mating with a printed circuit board or the like.

Although present molds and molding methods using epoxy resins generally provide an effective encapsulation for many purposes, a number of significant disadvantages do exist. For example, overall cycle time is long. Each time a mold is used, the cavities, runners and gates must be checked, cleaned and all flash removed. Otherwise, a clogged runner, gate or air vent will prevent the next molding operation from being carried out successfully. Because of the many cavities and runners, the precision machined mold members and resin distribution runners are difficult to clean and prone to damage and surface wear. Indeed, mold cleaning of the flash and cleaning of the air vents is very difficult even under the best of conditions. When using standard molding processes, the operator uses an air hose and brushes the mold surface to help remove the thin layers of cured plastic adhering to the mold surfaces. If the mold is not properly maintained the hardened surfaces become opened with thousands of tiny impressions which eventually cause, the mold to become useless as a manufacturing tool. It can be refurbished and reground but this takes the mold out of production and can take 3 days to a week or more to do.

Sometimes there is flashing in the runner areas, as well as, flash around ejector pins and cavities. This increases the amount of wasted plastic. The newer versions of these machine molds have automatic cleaning heads with rotating brushes and use air blasts or vacuum sources to remove plastic flash from the mold surfaces. Of course, it is not just the mold wear, or wasted plastic that is the main loss it is the time needed for cleaning time is money—the lost time is lost production. Cleaning usually takes at least a minute which is undesirable from a manufacturer's standpoint.

Furthermore, the epoxy resin plastic typically used to encapsulate an integrated circuit is heat curable, or thermosetting. As a consequence, much of the epoxy resin plastic which fills the runner system is wasted since, unlike thermoplastic materials which are cured by temperature reduction, thermosetting epoxy resin cannot be remelted and reused. In addition, because of the extensive runner systems of present day molds, the ratio of plastic in the runner system to the plastic actually used for encapsulation is undesirably high and results in considerable waste of plastic material These prior encapsulation methods also pose substantial risks to the effectiveness of the protection afforded the chip circuitry. First, as the hot viscous resin is introduced under pressure into the mold cavity, the delicate wire leads from the frame to the chip are stressed by the relatively rapid flow of the hot viscous resin through and across the cavity. Upon subsequent cooling of the resin, the leads are further stressed as the resin shrinks Such stresses often result in irreparable lead damage and reduce the yield of usable components or they may induce subsequent lead failures in the field. Indeed, "infant mortality" of packaged integrated circuits has been for many years, and continues to be, a significant and costly problem to the semiconductor industry. Second, the system of runners and gates inherently produces small integral plastic appendages on each package which must be broken off flush with the outer wall of the package after the latter has been removed from its mold. The areas of fracture thus produced provide microscopic openings ("micro-cracks") into the package wall which may later serve as passageways for moisture and contaminants and which eventually may cause failure of the electronic circuit device. For example, solvents used in the cleaning of completed packages may be allowed to penetrate such micro-crack openings and cause damage.

Because of such drawbacks, a need has existed in the art for another method of plastic encapsulation. It would be of particular advantage if the method would require less plastic, create less stress on delicate leads, require less mold pressure, take less processing time, easily adapt to automation, and, most importantly, result in a chip carrier that would provide a significantly higher level of protection for the electronic device enclosed therein. It would also be advantageous to provide a method of encapsulating that reduces or eliminates the need to clean the mold following every encapsulation.

In addition, with present encapsulation systems, there is no economic and convenient way to include extra planar conductor members such as heat sink members, electrostatic shields, cross-talk shield, strengthening members or moisture barriers. Therefore, a method which permits the economic and convenient addition of such members would be of significant advantage from the standpoint of both cost and utility.

Finally, another disadvantage of conventional plastic packages, such as the DIP, is that the inherent geometry of such packages has resulted either in a limitation on the number of external leads that can be utilized or an increase in the size of the package resulting in undesirable electrical effects and package dimensions which are incompatible with the surface area requirements of the circuit board into which the package will be incorporated. It would be of great advantage to provide a plastic package which would be capable of combining high lead counts, small package size, low production cost and high volume production.

SUMMARY OF THE INVENTION

I have now discovered a novel method and apparatus for making a plastic encapsulated electronic circuit device which realizes, to a significant degree, virtually all of the above expressed previously hoped-for improvements. The invention has applicability to a variety of electrical and electronic components including integrated circuit chips, resistors, gate arrays leadless chips, plug in gate arrays, pin grid arrays, leaded chip carriers, quad packs, surface mounted devices and combinations of these or similar integrated circuit components such as "hybrids", some components of which may already be protected by prior packaging and some components of which may have no such protection. The invention can easily be employed with high lead count and/or fine pitch (0.010–0.025 inch lead spacing) packages. As used herein, the phrase "electronic circuit device", unless otherwise indicated by the context, shall refer to any individual electronic circuit component of this general hype and to multiples or combinations thereof.

This invention provides a method and apparatus for forming an encapsulated electronic circuit device which includes: (a) a first assembly, including at least one electronic circuit device connected by bonded wires to an array of conductive leads extending therefrom, and (b) a second assembly, including plural generally parallel mutually laminated layers of plastic resin and fiber completely surrounding and encapsulating the first assembly except for the distal ends of the leads which remain exposed for external electrical connections. Preferably, the layers of plastic resin and fiber are layers of resin impregnated glass fiber containing up to 40% or more glass fiber content by weight. The array of conductive beam leads may include plural conductive lead frames spaced apart in parallel planes and mutually insulated by at least one layer of plastic resin and fiber therebetween. Heat conductive material may also be laminated into at least one of the layers (e.g., a relatively upper layer which may at least in part also extend to the outside of the package for a conductive thermal connection) and/or at least one of the outermost layers may include electrically conductive material (e.g., a metallic conductor or carbon particles) so as to minimize buildup of electrostatic charges thereon. If it is desired to stop penetration of ultraviolet or other light radiation from reaching the protected circuit components, then one or more prepreg layers may include black or other suitably colored or pigmented or treated plastic resins.

The present invention also permits fabrication of carriers having high lead counts not previously achievable in plastic carriers of comparable surface area measurements. For example, an assembly of an integrated circuit die electrically connected by bonded wires to a planar array of conductive beam leads may be held in a heated mold between opposing relatively movable press faces by engaging outwardly extending portions of the beam leads or by other means. Plural fiber/resin prepreg sheets are placed into the mold on both sides of the assembly in a generally parallel relationship to the held planar array. At least one of the inner prepreg sheets may include an internally cut out window area to fit around and house the integrated circuit die and bonded wires. Then the press faces are moved towards one another to apply heat and pressure to the glass fiber prepreg sheets within the mold and sufficient heat and pressure are maintained thus mutually laminate the prepreg sheets into a unified thermoset encapsulation of the integrated circuit die and its bonded wires. In fact, at times, it may be desirable to cause the viscous resin to flow (i.e., extrude) from the prepreg sheets into the cutout window area.

Complementary upper and lower mold bases and mold members are typically provided and positioned one above the other, with the upper mold base having a downwardly directed plunger and the lower mold base having an upwardly directed plunger. The bases and plungers are maintained at conventional operating temperatures by conventional electric cartridge heaters.

The complementary mold members each include a cavity and a means for positioning and holding a lead frame (with an integrated circuit mounted thereon) within the perimeters of the cavity in spaced relationship with respect to both of the plungers. In the case of plug-in type lead frames, the lower mold will include an array of apertures mated to receive the transversely extending array of plug-in pins. The cavities are configured to accept a plurality of pre-shaped and sized "prepreg" (e.g., woven glass fabric impregnated with a thermosetting epoxy resin) cloth layers such that a separate stack of such layers is positioned above and below the lead frame (and at least one such layer between each pair of adjacent lead frames when a plurality of frames are employed) and the integrated circuit mounted thereon. Thus, as the upper and lower mold bases are closed to confine the lead frame(s) and both plungers are brought to bear in opposite directions on the separate prepreg cloth layers, the stacks of prepreg cloth are compressed and fused under sufficient heat and pressure to form an encapsulation of the integrated circuit and the central portion of the lead frame(s) to which it is affixed. The degree of heat and pressure required to successfully laminate such commercially available prepreg layers is conventional and already well described in the public literature.

The number and the composition of the prepreg layers employed in each stack depends upon the thickness, form and fit desired for any particular encapsulation. The layers of cloth are preferably sized to closely and precisely fit in the mold cavities and to provide the desired final carrier size. However, some clearance (e.g., 0.010 inch) is provided to permit (a) easy insertion into the mold and (b) space for plastic to be extruded outwardly from the prepreg during the pressing operation so as to completely encapsulate the overall package in a substantially continuous thin layer of protective plastic. A preferred cloth is an epoxy impregnated woven glass fiber mat, although other types of fiber and cloth construction may be used if desired. For example, the fibers may comprise a known non-woven (e.g., matted) structure. And fibers other than glass may be used although glass is presently preferred because, for example, of its relatively high strength and thermal conductivity.

For most integrated circuit applications, the layers adjacent the integrated circuit are provided with cutout portions or "windows", as mentioned above, so that the assembly of such layers will form a "device housing volume" or cavity which will accommodate the raised portions of the integrated circuit and either the hair-like lead wires bonded to and emanating therefrom or tape automatic bonding film. Thus, compression of the multiple layers does not unduly affect the circuit or unduly damage the lead wires, nor does it cause a too-rapid flow of viscous plastic across the device (as encountered in present day plastic molding techniques) which could harmfully stress the wires. During the final stages of compression, however, relatively small amounts of viscous plastic resin can be extruded from the interior, if desired, by using a larger percentage of plastic on the prepreg, and exterior edges of the "windowed" layers at low flow rates. Thus, when compression of the layers is complete, the cavity formed by the layers of superimposed windows may become partially or substantially filled with plastic, which, when thermoset, provides further protection for the device and lead wires. Furthermore, the entire outer surface will typically be sealed with a continuous exterior layer of thermoset epoxy plastic.

In accordance with a further aspect of the present invention, an apparatus and method for automating the encapsulation of electronic circuit devices is provided. The automated apparatus includes an upper mold, a lower mold, and first and second holding devices, such as first and second rows of bins, for holding fiber resin prepregs adjacent to the molds prior to the encapsulation process. Such bins can be provided on both sides of the molds. First and second transporting devices or arms with prepreg pick-up devices mounted thereto for transporting prepregs from the holding devices to a point intermediate the upper mold and the lower mold are further provided so that the prepregs can be placed in between the molds on either side of an electronic circuit device to be encapsulated. A conveyer is mounted adjacent one end of the molds, for example, for conveying circuit devices to be encapsulated to a point intermediate the molds. In a preferred embodiment, the fiber resin prepregs are preheated during transport from the first and second holding devices, respectively. As will become apparent, such an apparatus can quickly and efficiently produce encapsulated circuit devices.

The present invention also contemplates an automated encapsulation method and apparatus which will minimize the need for extensive mold cleaning following encapsulation. More particularly, the use of prepregs rather than providing runners and molten resin minimizes the need for subsequent cleaning. Further, the use of pretreated mold surfaces such as Teflon, dicronite, titanium nitrate, chrome, etc., alone or in combination with non-stick temperature resistant plastic sheeting introduced into the mold reduces or eliminates the need for cleaning after each shot. For example, first and second rollers can be mounted for rotation on opposite ends of the molds and a non-stick film material can be mounted to the rollers so as to extend between the upper and lower molds. Preferably, there are two sets of rollers so that two sheets of non-stick film extend between upper and lower molds cavities so that sticking of encapsulated electronic device to both of the mold cavities is prevented.

When the described fusing process, which requires only very few minutes, is completed, the layers of fibers will have been fused by the resin into a substantially hermetically sealed IC or other electronic circuit device "carrier". This "package" has protective properties and mechanical strength Superior to those of conventional plastic packages while avoiding many of the earlier drawbacks of fabrication which increase the likelihood of weak or defective circuits. If desired, in order to reduce the molding time cycle even further, the stacked layers can be partially compressed and partially pre-cured, or post-curing of the molded carrier can be effected in bulk after the individual packaged circuit is removed from the mold.

The method of this invention, for some of the less complicated embodiments, may be utilized in a conventional compression or transfer molding machine or any similar device capable of exerting controlled pressure upon a mold while applying regulated heat thereto. Relatively minor mold modifications (e.g., a stepped parting face and/or slots for insertion of prepreg sheets and/or an array of apertures for receiving plug-in pins) permits even more complex multiple lead frame or plug-in type lead frame embodiments to be realized and/or facilitates production of the packaged devices (e.g., by facilitating placement of the prepreg sheets within the mold). The method is also suitable for automated loading and unloading operations when large volumes of integrated circuits are to be processed. And it is convenient to incorporate conductor members, electrostatic shield layers (e.g. metallic or carbon-loaded conductive epoxy layers), heat-sink members, strengthening members or even multiple lead frames as integral components of the carrier body. Such layers should be close to the top and bottom of the chip to enhance their thermal conductivity, moisture resistivity, cross-talk reduction and/or x-ray protection characteristics. Where the carrier includes two or more lead frames, the resulting package may conveniently be provided with double, or more, the number of leads usually obtainable in plastic packages of comparable surface-area size.

The laminated carrier structure may be stress relieved (to reduce the chance of mechanical bond failure) at 350° for one hour to help eliminate a major present cause of IC failures. The laminated carrier structure also provides a structure that resists the mechanical stresses involved during IC life and it helps protect it in various environments (e.g. solvents and cleaning chemicals, heat, solder flux, and soldering or wave soldering or surface mounting).

Heat rise adversely affects the operation of IC memory, microprocessor, bipolar, field effect devices, etc. and good heat dissipation is therefore extremely important. In particular, military applications typically require good thermal dissipation, moisture barriers and cross-talk and x-ray protection. The glass fibers are relatively good heat conductors compared to typical plastic resins. In addition, extra "heat sink" thermal conductors can be conveniently included as extra layers in the laminated structure.

To facilitate cutting the prepreg sheets prior to actual lamination, it may be preferable to hold them at some relatively low temperature (e.g. 40° F.) so as to reduce their "tackiness." On the other hand, some "tackiness" might be beneficial in positioning the cut sheets (e.g. with respect to the lead frame) prior to the actual laminating process. Alternatively, stacks of two or more prepreg sheets may be initially subassembled by "spot welding" (with small area applications of heat and pressure) or spot gluing them together with a suitable adhesive to facilitate the overall assembly process.

The relatively low required laminating pressure should reduce flow and adhesion of plastic material to the lead frame thus reducing cleaning time and costs. Low shrinkage of the laminate will make it more compatible to expansion and contraction of a printed circuit board and thus reduce the chance of causing solder joint stress particularly with surface mounted devices. Woven glass in the laminate reduces heat induced expansion of the resulting package. And a woven content in the laminate increases its strength and reduces stresses when lead forming operations occur.

At present, plastic mold size has to accommodate the entire runner system which also reduces the number of cavities available. In addition, the runner surface area has to be calculated in the tons of mold clamping required. When the runners are eliminated (as in this invention) this increases the potential number of cavities in each press and thus permits more cavities to reside in the same size mold and/or the same size press, or allows the pressure applied by the mold to decrease while maintaining the number of cavities constant. Reducing investment in equipment and molds and increasing productivity per hour equals lower costs per part. In this invention, no runner system is needed because each cavity uses prepreg sheets cut to finished cavity size. Further, relatively low press pressure is required with his invention because required lamination forces are only vertical.

This invention may eliminate the typical need for chip and lead protection with a secondary plastic or gel, such as silicone, although the invention is also compatible with such protection. The use of woven fabric in the lamination reduces shrink of plastic and stresses of plastic as well as stresses, pull and/or shear forces on the chip wafer and/or bonded lead wires or tabs.

After the flat lead frames are encapsulated, they typically undergo a series of punch press operations that "singularize" the ICs and bend the leads at a right angle (unless the leads are already of the transversely extending "plug-in" pin type) to allow easy insertion into a printed circuit board or socket or the like. This trim and form process causes high stress at the edges of the IC, as the leads are bent at a point only 0.040 inch from the point that they exit the plastic. In general, a flexual strength of perhaps 18000 psi is required to prevent microcracking which could degrade the environmental protection expected from the package. Thus the generally improved package strength afforded by this invention will be of great benefit in minimizing such microcracking.

Electric static discharge (ESD) is possibly the most serious outside effect that causes IC failure, some are even more prone to ESD (e.g. such as MOS and CMOS devices). Each semi-conductor manufacturer has grounded equipment throughout the manufacturing process as well as grounded and special packing to help protect these sensitive devices. Thus the ability to include electrostatic shield or moisture barrier layers in the package of this invention is of great potential benefit.

As already mentioned, a significant cause for failure in plastic IC packages or carriers is stress of the fine wire bonds. In some cases this can be caused during the transfer molding of the epoxy into the mold cavity and during the normal heat rise which occurs while the IC is operational (such as with bipolar, field effect devices, memory and microprocessor IC's to name a few). The expansion of the heated epoxy package (that has the fine wire leads embedded within it) can, in effect, pull on them and cause a break in the wire or wire bonds. The woven glass reinforcement in the preferred embodiment reduces this tendency.

BRIEF DESCRIPTION OF THE DRAWINGS

These as well as other objects and advantages of this invention will be better appreciated upon reading the following detailed description of the presently preferred exemplary embodiments in conjunction with the accompanying drawings, in which:

FIG. 1 is a perspective view of an exemplary integrated circuit carrier according to the present invention, showing the body of the carrier and the beam leads extending therefrom before being "singularized" by cutting the "dam" or frame structures along the shown dotted lines 99 into individual separate beam leads;

FIGS. 2A and 2B schematically depict an exemplary lamination/encapsulation process;

FIG. 6 is a perspective view, similar to FIG. 1, showing another exemplary embodiment of the invention but using a pair of lead frames to increase the number of possible external electrical connections;

FIG. 7 is a side view of exemplary 10 stepped parting plane mold edges which may be used to produce the embodiment of FIG. 6;

FIG. 9 is an exploded perspective view of the lamination process for an exemplary "plug-in" pin array type of circuit carrier also showing the modified laminating mold used in its production;

FIG. 10 is a perspective view similar to FIG. 1 but depicting the exemplary "plug-in" pin array circuit carrier embodiment also depicted in FIG. 9;

DETAILED DESCRIPTION OF THE PRESENTLY PREFERRED EXEMPLARY EMBODIMENTS

Figure 3:
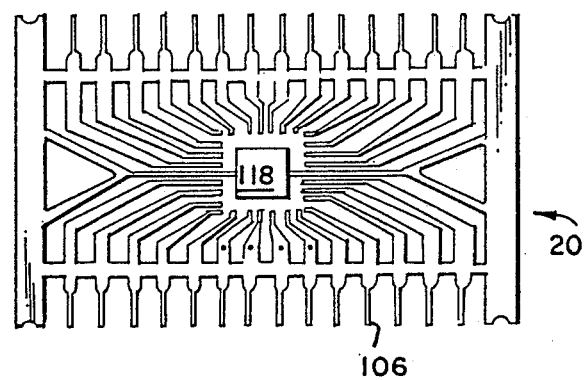
FIG. 3 is a plan view of a typical planar conductive beam lead "frame" used in the FIGS. 1, 2A and 2B.

Although the utility of the present invention is quite broad, and can be applied to a variety of electronic circuit devices such as resistors, integrated circuit die or chips, gate arrays, leadless chips, plug-in gate arrays, leaded chip carriers, quad packs, "hybrid" combinations of these or similar electronic components and the like, it may best be described in relation to the encapsulation of a single device such as an integrated circuit die or chip, in which there are a plurality of bonded wire leads extending from the device to be protected.

A novel form of encapsulated integrated circuit 66 is depicted in accordance with this invention in FIG. 1. The semiconductive chip or die 22 resides in a central location and is electrically connected by very fine wires 23 bonded at one end to conductive pads on the integrated circuit 22 and at their other ends to conductive beam leads (part of a beam lead frame 20) emanating from the periphery of the central area housing the chip 22. Alternatively, tabs may be employed for electrical connection to the chip. The silicon wafer or chip 22, the bonded lead wires 23 and the adjacent portions Of the conductive beam lead frame 20 are all encapsulated by a plurality of laminated epoxy impregnated glass fiber layers 62 located above the lead frame 20 and by another plurality of similar layers 64 located below the lead frame 20.

Accordingly, there are a plurality of glass fiber layers 100 within the stack of layer 62 disposed above lead frame 20. These glass fiber layers 100 are laminated together by thermoset epoxy plastic layers 102 (which of course actually permeate and extend through the fiberglass layers 100). A similar arrangement of laminated layers of glass fiber and thermoset epoxy resin forms the stack of layers 64 extending under the lead frame 20. And, as depicted, the lead frame 20 is itself captured within and encapsulated by the laminated stacks of layer 62, 64.

During the ensuing discussion of the presently preferred embodiments, it is assumed that the stacks of layers 62, 64 comprise separate individualized cut sheets. However, it may also be desirable to form one or both stacks by merely folding (accordion style) an elongated strip of prepreg material. This would avoid the need to cut each layer separately and, especially if the outer ends are folded back around the entire stack, may present a more "finished" outward stack appearance and reduces chances of moisture entering the package. It may also simplify the handling of the multi-layer stacks. Another variant is to wrap a separate prepreg outer layer around one or both of stacks 62, 64 to achieve some of these possible advantages. Other possibilities will occur to those skilled in the art in view of this disclosure.

During the lamination process, sufficient plastic material is typically extruded outwardly and shaped by the mold so as to form a relatively thin encapsulating outer layer 104 of plastic. This outer layer is a substantially continuous encapsulation of the entire package except, of course, for the beam leads 106 extending therethrough. As will be appreciated by those in the art, the "dam" or frame portions of the beam lead frame 20 are cut away (as shown be dotted lines 99 in FIG. 1) so as to "singularize" the individual beam leads 106. These leads are also typically bent at substantially 90° downwardly (e.g., along bend line 108 or the like) such that the relatively narrowed distal ends of the beam leads 106 are properly arrayed to mate with an underlying printed circuit board or other electrical circuit connector.

As depicted in FIG. 1, if desired, extra planar layers of various types may be conveniently included within the encapsulated mass or stack of layers 62, 64. For example, a metallic heat conducting layer 110 might be included at a selected location within the stack so as to improve the conduction of heat outwardly away from the active circuit element 22 toward the edges of the packaged device. If a metallic sheet is used as the heat conductor, then it may have perforations as shown in FIG. 1 so that portions of the adjacent plastic and fiber layers 100, 102 are extruded through such perforations to physically bond and laminate the layer 110 within the stack of laminations 62. Of course, such perforations need not be included. Although in some embodiments the metallic heat conductor 110 might extend to (possibly at places even completely through) the edges of the package so as to make conductive thermal connection with a heat sink or the like, it has been schematically depicted at FIG. 1 as terminating within the package.

Another type of extra layer that might be included within the laminations is also depicted as the top layer 112 and bottom layer 114. So as to help prevent buildup of electrostatic charges, these outermost layers of plastic resin layers (and perhaps even more of the outer layer 104) may be made electrically conductive (e.g., as by loading with carbon particles or embedding thereinto perforated metal, wire mesh conductor, conductive fibers, spheres, granules, plated microspheres or microballoons, etc.). By this feature, electrostatic charges may be conducted away from the package (e.g. by contact with grounding contacts) and/or suppressed at the outset by suppressing their generation.

These outermost layers (or more) may also include suitably colored pigmentation or the like to stop penetration of ultraviolet or other radiations which may damage the particular circuit to be protected.

As also depicted in FIG. 1, the glass fiber layers 100 within stack 62 nearest the chip 22 are preferably precut with central "window" areas so as to define a centralized device housing volume within their boundaries. Preferably the outer edges of this volume are sized so as to not unduly press against the fine wire leads 23 during the encapsulation and lamination pressing processes. However, as depicted by 116, during the lamination process, some of the plastic material will be extruded into the central volume so as to partially or substantially fill it. As depicted in FIG. 1, resulting thermoset plastic extrusions 116 may (as illustrated) actually extend into the central volume from the adjacent laminated layers and thus at least partially (if not wholly) embed the fine wires 23, the device 22 and the innermost ends of the beam lead conductors 106 within a protective solidified plastic encapsulation internal to the central device housing volume. Of course, if less plastic is employed, such extrusion can be reduced or eliminated.

The overall lamination process is schematically depicted at FIGS. 2a and 2b. The beam lead frame 20 (e.g., see FIG. 3) includes a central support portion 118 which is supported within a central area of the lead frame 20. Other conductive beam leads extend more or less radially (as depicted in FIG. 3) from the central support area 118 to an array of connector pins integrally formed at the distal ends of the conductive beam leads 106. As earlier mentioned, this entire structure is held together by a more or less rectangular "frame" or "dam" structure (which helps "dam" the undesired flow of plastic outwardly along the beam leads) which is initially an integral portion of the entire array of conductive beam leads 106 and central support area 118.

An electronic circuit device 22 is typically first conventionally affixed to the central support area 118 of the beam lead frame 20. Thereafter, fine connective wires 23 are used to conventionally interconnect appropriate conductive pad areas on the device 22 with respectively associated ones of the beam leads 106. Typically the fine wires make bonded connections at either end as is conventional and well known in the art.

Thereafter, as depicted in FIG. 2a, stacks 62 and 64 each comprising plural layers of prepreg are assembled (in a mold) both above and below the first assembly comprising lead frame 20, the device 22 and the lead wires 23. (Some of the prepreg layers 62 preferably include a cut out "window" so as to define a central device housing volume as earlier described.)

Subsequently, both the first assembly (lead frame 20, device 22 and wires 23) and the second assembly (the stacks of plural prepreg layers 62, 64) are laminated together under suitable heat and pressure as depicted in FIG. 2b. The result is the encapsulated "carrier" or integrated circuit chip product 66 as earlier depicted in FIG. 1.

Figure 4:
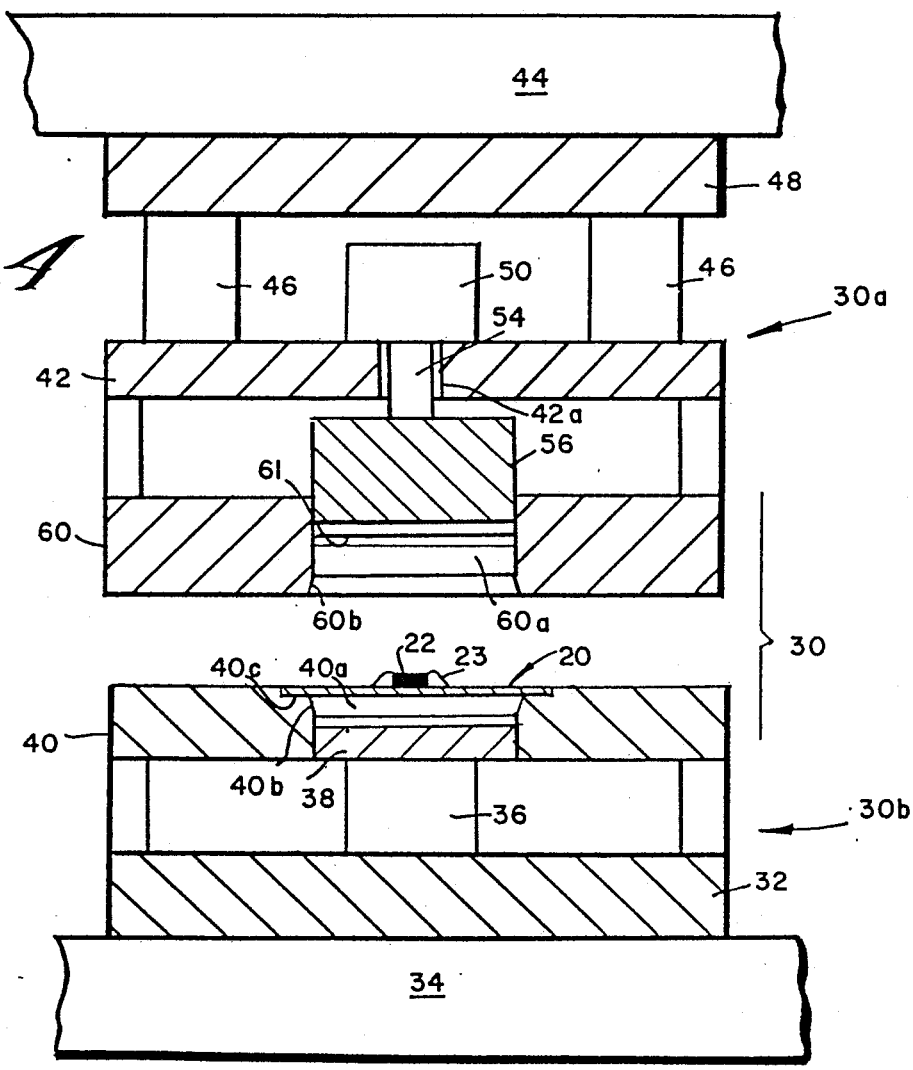
FIG. 4 is a partially in section of a typical molding apparatus that may be utilized in the practice of the invention.

As shown in FIG. 4, one typical mold apparatus that may be employed in the method of this invention is illustrated generally by the numeral 30. The mold 30 includes two sections, an upper mold portion 30a and a lower mold portion 30b. These sections are aligned and removably mounted for operation within a conventional compression or transfer molding machine or similar device (not shown) which is capable of being operated so as to apply controlled pressure and regulated heat (through the mold) to the material to be molded. The lower mold portion 30b includes a lower mold base 32 mounted upon a stationary bottom platen 34 of the molding machine. Centrally positioned within the lower mold portion 32 and secured to the bottom platen 34 is a conventional ram cylinder 36, pneumatically or hydraulically powered, which projects upwardly from the lower mold base. A movable plunger 38 drivingly coupled to ram cylinder 36 is upwardly directed therefrom for vertical movement through a relatively short stroke of travel, such as one to two inches. It is preferred that the driving pressure provided to plunger 38 by ram cylinder 36 be adjustable, for example over a range of 200–350 p.s.i., and be further controlled so that the speed of the plunger in an upward direction is variable.

A lower mold plate 40 is positioned above the lower mold base 32 and is rigidly coupled thereto along its outer edges. The lower mold plate 40 has a central cavity 40a, into which the plunger 38 partially extends in its bottomed position upon ram cylinder 36. Cavity 40a and plunger 38 are sized to receive and later compress layers of material, to be fully described later, each of which layers is dimensioned to have approximately the same length and width as the length and width of the completed carriers (see FIG. 1). The lower mold plate 40 is provided with a ledge 40c extending beyond the periphery of cavity 40a at the upper surface of the plate. This ledge 40c is adapted to support the edges of the lead frame 20 on which the device 22 to be encapsulated is mounted. An outwardly tapered surface 40b leading to the ledge near the upper end of the cavity provides a draft which facilitates removal of the encapsulated product.

The upper mold portion 30a includes an upper mold base 42 adapted to be movably mounted beneath an upper platen 44 of the molding machine, the upper mold base being coupled to the platen by means of a set of cylinders 46 and a mounting plate 48. The cylinders 46 are conventional pressure exerting devices adapted to act in unison to move the upper mold base 42 vertically to thereby close or open the mold 30 during operation.

A ram cylinder 50, similar to cylinder 36, is affixed to the top of the upper mold base 42 and is positioned so that its internal driving rod 54 projects downward through a hole 42a centrally formed in the upper mold base. A plunger 56 is connected to the external end of driving rod 54 and thus movably driven by ram cylinder 50 through a stroke of travel in an upward or downward direction substantially aligned with the movement of the plunger 38 within lower mold portion 30b. It should be understood that the travel stroke of plunger 56 need not be the same length as that of plunger 38 and, due to differences in configuration of the upper and lower mold portions, the stroke of plunger 56 may typically be greater than the stroke of the lower plunger stroke. It should also be understood that a typical commercial molding installation will include multiple mold cavities and pressure plungers operated in parallel by common actuating pneumatic cylinders or the like.

An upper mold plate 60 positioned beneath the upper mold base 42 is rigidly coupled to the base along its outer edges. Upper mold plate 60 has a central cavity 60a and is mounted so that cavity 60a directly faces and is vertically aligned with cavity 40a in the lower mold plate 40. Cavity 60a is adapted to receive plunger 56 which partially extends into the cavity at the uppermost position of its travel stroke. Cavity 60a and plunger 56 are sized as described in connection with cavity 40a and plunger 38. It should be noted that plunger 56 should preferably be positioned to remain within cavity 60a during all stages of operation of mold 30 to assist in maintaining proper vertical alignment and to maximize heat retention during successive operations. Alternatively, however, it may be desired to initially position plunger 56 vertically offset from and above cavity 60a in order to facilitate loading of the cavity.

An outwardly tapered surface 60b, similar to the tapered surface 40b within the cavity 40a of lower mold plate 40, is provided at the lower end of cavity 60a nearest the component 22 to be encapsulated so as to provide a draft, thereby facilitating removal of the encapsulated product from the mold 30.

It is to be understood that the lower and upper mold bases 32, 42 are conventionally and removably secured to respective operating parts of the compression molding machine or other suitable device which imparts vertical motion and pressure to the mold bases 32, 42 to bring the plungers 38, 56 together in a manner hereinafter described.

The material which is to form the body of the encapsulating package or carrier is, in the exemplary embodiment, a resin impregnated fibrous mat or cloth having a mat thickness on the order of 4 to 10 mils and a total thickness averaging 6 to 12 mils. As described more fully hereinafter, a plurality of layers of such material, typically fourteen or more is employed. The resin is of a thermosetting type, preferably epoxy, and has a polymerization gel time of only about 3 to 5 minutes, or even as low as 30 seconds, at about 330° to 350° F. Preferably, the fiber content of each layer should be high relative to the resin, for example, about 40% or more by weight, for reasons which will be explained hereinafter. In fact, a 70% sheet, 30% resin has been employed successfully. Also, I prefer to use glass fibers for most applications (e.g., because of strength and heat conducting properties), although other types of fibers such as, for example, Kevlar, a trademark of E. I. DuPont de Nemours, may be employed if desired for some random, i.e., oriented) fiber structure, but preferably (for strength purposes) comprise a woven cloth or fabriclike construction.

Resin preimpregnated fibrous cloth which meets the foregoing requirements is commercially available and is known in the trade as "prepreg" cloth. Such prepreg material has the ability to adhere to itself in adjoining layers to form a laminated solid mass when subjected to heat on the order of 300 to 400 degrees Fahrenheit and compression on the order of 200 to 350 pounds per square inch. For most applications an epoxy prepreg, such as CYTRON, manufactured by the American Cyanamid Company, is preferred. Such epoxy prepreg cloth is available with a woven glass fiber content of at least 40% (by weight) and a thermosetting resin content of no greater than 60% (by weight), which satisfies the requirements of the presently preferred exemplary embodiment. A suitable fiber structure might also be impregnated with phenolic, polyester or polyimide products. Thus, it will be understood that conventional application of suitable pressure and heat to layers of such prepreg cloth for a suitable length of time will cause the alternating layers of resin and fiber to be permanently fused or laminated together. The term "prepreg" is used herein in a broad sense referring to any thermosetting plastic impregnated fiber layer capable of being laminated to similar other layered structures.

The prepreg cloth may be prepared, well in advance of the molding operation if desired, by precisely cutting sheets thereof to the approximate length and width of the desired package, or within 0.010 to 0.015 inches of the dimensions of the cavities 40a and 60a, to facilitate the formation of precisely aligned stacks of appropriately sized layers between the respective plungers 38 and 56. Precise sizing of the individual layers within the mold cavities, in view of the relatively low resin content minimizes horizontal spreading as the prepreg layers 62, 64 are compressed and fused to form the encapsulation 66. It should be understood, therefore, that virtually all of the fiber and plastic resin utilized ultimately will form part of a completed encapsulation package and that substantially none of the prepreg material used in the stacked layers must be discarded as waste.

In many instances, the prepreg layers 62, 64 closest to the integrated circuit 22 to be encapsulated may have central portions cut away to avoid imposing stresses on the hair-like leads 23 which connect the circuit to the lead frame. For example, a centrally located square "window", ⅜' by ⅜'', may be cut from the lowermost several layers of stack 62 (or from at least one such layer), thereby providing a cavity of suitable depth to accommodate a typical integrated circuit 22 and its bonded leads 23. Thus, during vertical compression of the stacks 62, 64, the layers of glass and resin will not bear so directly on the delicate electrical elements and thus is less likely to damage same.

It is common practice to mix the epoxy resin used in conventional transfer molding methods with lubricants, such as carnuba wax, silicone or talc. Such lubricants ease the removal of the encapsulated end product from present day molds. However, with respect to the integrated circuit and its leads, the lubricants are reactive impurities which induce deterioration and eventual failure of the integrated circuit. It may be possible to minimize usage of such lubricants in or with the prepreg layers 62, 64 used to form the encapsulation 66 of this invention. In that case, integrated circuit failures caused by the use of such lubricants might also be reduced.

Figure 5A:
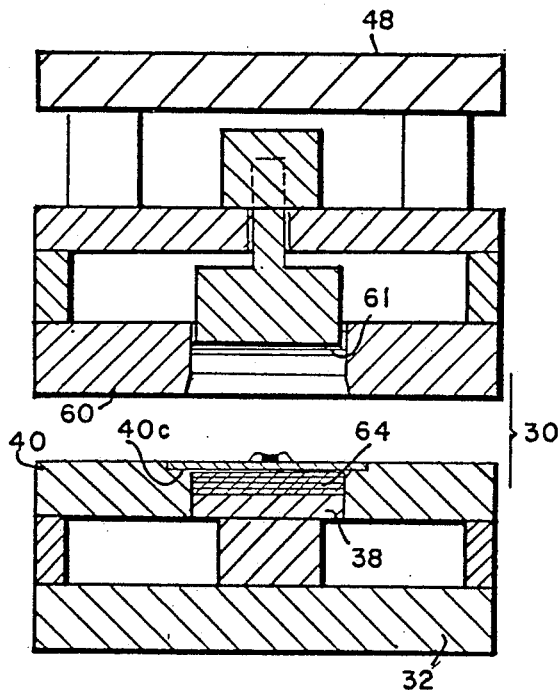
FIGS. 5A through 5D illustrate various steps of an exemplary method of forming the carrier shown in FIG. 1 using the molding apparatus of FIG. 4.

Referring now to FIGS. 5A-5D, one exemplary encapsulation method of the present invention can be described by viewing an operational sequence of mold 30. Initially, with the mold 30 open and upper and lower mold portions 30a, 30b apart, as shown in FIG. 5A, a selected number of precisely sized and close-fitting prepreg layers 64 are loaded into the lower cavity 40a, the prepreg layers being placed in a stack upon the upward face of bottom plunger 38. For example, in order to effectively encapsulate an integrated circuit to produce a package approximating a commonly-employed 28 lead Dual-Inline-Package, the prepreg sheets may be cut into sections approximately 1⅜" by ¼", with eight to twelve such layers comprising each of the top and bottom stacks. The numbers of layers may be varied as desired to suit particular requirements. For example, if it is desired to produce a package having the same thickness as a plastic DIP, and that average dimension is 0.150", the average thickness of the prepreg cloth is 8 mils, (0.008"), and the lead frame is about 10 mils (0.010"), then nine layers of prepreg may be used for each of the top and bottom stacks. That number will ensure that, after compression, the layers will be firmly bonded together, and that sufficient flow of viscous thermoset resin will cover and encapsulate the cut outside edges of the glass cloth, but without excessive, or even any, squeeze out of resin. Thus, the shape and number of layers n in each of the prepreg stacks 62, 64 (n is the number of layers which may be different in stacks 62, 64) depends on the final desired dimensions of the encapsulation package.

Figure 5B:
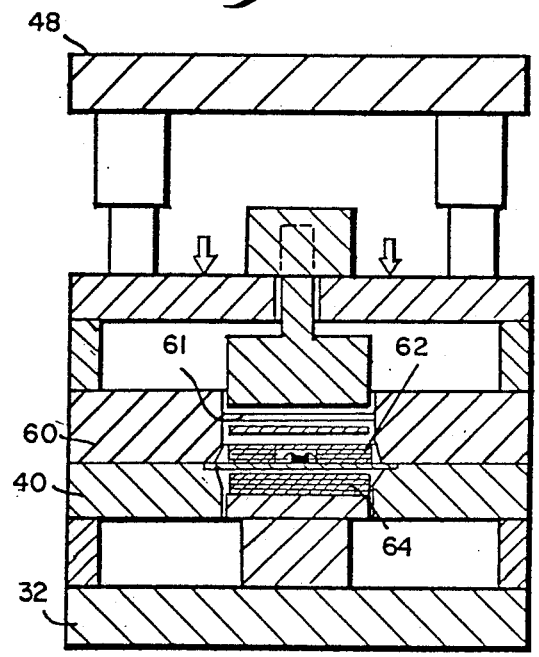
Figure 5C:
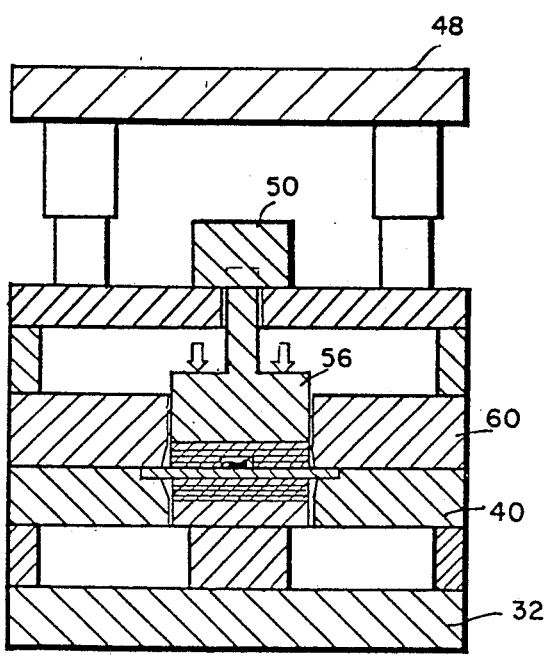

Thereafter, the lead frame 20 with device 22 to be encapsulated is positioned upon the ledge 40c above the previously placed prepreg layers 64. Then, via activation of the cylinders 46, the mold 30 is closed, the upper mold portion 30a being urged downward, until it abuts the lower mold portion 30b thereby securely and sealingly clamping the upper and lower surfaces of the lead frame 20 between the respective upper and lower mold plates 60 and 40, as shown in FIG. 5B. At this point, the motion of the upper mold portion 30a is halted and a corresponding number of precisely-sized, close-fitting prepreg layers 62 are loaded into the upper cavity 60a in a stack beneath upper plunger 56 through an access slot 61 provided at the front of upper mold plate 60 between the plunger and a ledge surface (not shown). Thereafter, (as shown in FIG. 5C), ram cylinder 50 is activated to move the upper plunger 56 downward further in cavity 60a to an intermediate position in close proximity to the upper stack of prepreg layers 64, preferably at a distance from the upper prepreg stack that is substantially equidistant to the spacing between the lower stack of prepreg layers 62 and the bottom of lead frame 20.

Figure 5D:
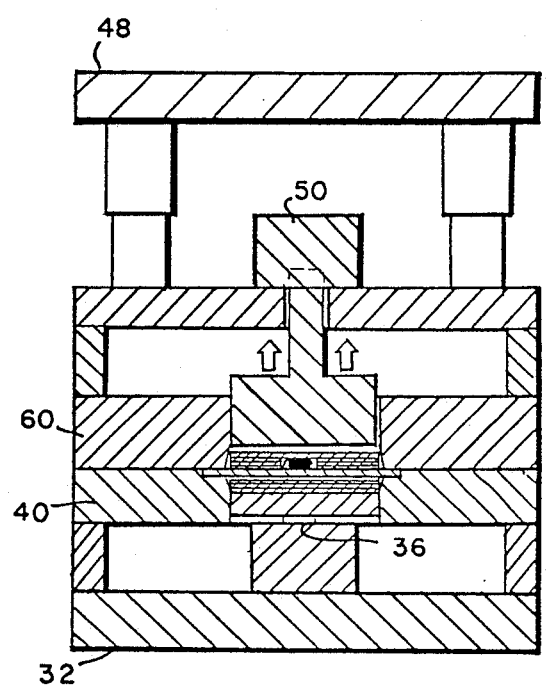

From such an intermediate position, the upper plunger 56 is then advanced within upper cavity 60a through its full downward stroke, and 35 simultaneously therewith, the bottom plunger 38 is advanced upward within lower cavity 40a via ram cylinder 36 thereby applying compressive forces to the upper and lower prepreg stacks 62 and 64 under sufficient heat so that the individual prepreg layers fuse together about lead frame 20 to form an integral laminated encapsulation 66 containing the integrated circuit 22, as shown in FIG. 5D. It should be emphasized that the level of fusion resulting from the application of the compressive forces and heat to the prepreg stacks 62 and 64 should be sufficient to cause the flowing and merging of viscous thermosetting prepreg resin along the peripheral edges of the individual prepreg layers to ensure that the encapsulation 66 provides sealed, moisture-proof containment of the integrated circuit 22.

After passage of a sufficient time period, such as about thirty to sixty seconds, depending on the type of prepreg material and the amount of heat and pressure applied, the upper plunger 56 may be advanced via ram cylinder 50 while the upper mold portion 30a is withdrawn to eject encapsulation 66 from upper cavity 60a. It should be understood that ejection of the encapsulation 66 from the open mold 30 may be effected by further advancing the travel of bottom plunger 38 slightly upward through lower cavity 40a.

The upper and lower mold portions 30a and 30b and their respective plungers 38 and 56 are heated to operating temperatures on the order of 300 to 400 degrees Fahrenheit by conventional electric cartridge heaters (not shown) conventionally located within the respective mold bases 42 and 32 or elsewhere. Each of the heated plungers 56 and 38 need only apply pressure in the order of perhaps 200 to 600 pounds per square inch to effect the required fusion of the prepreg layers 62, 64.

One or more layers of approximately sized and shaped metallic, planar conductors or electrically conductive plastics (e.g., carbon loaded) may be substituted for one or more of the prepreg layers 62, 64, or included in addition to such layers. Such planar members may be provided to act as heat sinks or, when, used as top and bottom electrostatic shield layers, they could act to reduce or eliminate electrostatic discharge, moisture contamination and/or cross-talk. Holes in solid metallic layers would allow fusion of the prepreg layers 62, 64 thereabout without substantially impairing the heat sink or discharge functions.

Since the forces applied to the prepreg layers 62, 64 are substantially only vertically directed and since the prepreg layers closely fit within the cavities 40a and 60a, horizontal flow of extruded viscous epoxy material (e.g. due to being pressed or squeezed together vertically) into the internal device housing volume (or outwardly about the outside of the stacked layers) during the fusion stage will be at relatively slow controlled flow rates, and therefore, little or no lateral stressing of the hair-like leads 23 emanating from the integrated circuit 22 will occur. Such stressing is often induced by conventional transfer molding techniques and this may cause undesirably high failure rates in the hair-like leads 23 emanating from the integrated circuits.

Each prepreg layer 62, 64 preferably contains (by weight) at least about 40% but not more than about 60% plastic. It is, therefore, considerably less expensive than using ceramic material, since ceramic material (as in conventional ceramic carriers) may typically cost many times more than the material cost of plastic. In addition, since less plastic is used overall to form the encapsulation 66 than in a typical prior all plastic carrier, the curing time is reduced and the production rate is accordingly increased. The high percentage of glass content at the same time provides significantly improved heat conduction away from the encapsulated device (because glass is a relatively good conductor of heat), increases the mechanical strength of the package (e.g., so as to avoid microcracks when the edges of the carrier are necessarily stressed during singularizing of the lead frame), improves its electrical insulation properties, decreases the risk of stress cracks due to shrinkage of resin—all in comparison to existing plastic packages—and desirably provides in combination with the epoxy resin a coefficient of thermal expansion which closely approximates that of commonly used epoxy based printed circuit boards.

This last feature is a particular advantage over ceramic carriers which have a considerably different coefficient of thermal expansion thus leading to mechanical stresses (with temperature changes) after they are rigidly affixed (e.g. by soldered connections of a leadless carrier) to an epoxy-based printed circuit board.

Curing time in the mold can be further reduced by post-curing of the packages, preferably in bulk. The time required for optimum, final curing of the resin is longer than the time usually required for compression, squeeze-out of air pockets and adequate adherence of the respective layers and flow of resin into and over the fibers and cut edges. Accordingly, I have found that partially cured packages can be removed from their molds while not yet finally cured, and that final curing of the resin can be effected by placing such packages, in bulk, in a curing oven at an appropriate temperature, e.g., 350° F., for an appropriate time period (e.g. about one hour). Thus, the process time needed for compression and molding of the encapsulation package of this invention can be reduced in many instances to one to one and one-half minutes or less.

Although the exemplary method has been illustrated by reference to a single cavity mold, it will typically be implemented as a multi-cavity mold with the added benefit that a significantly smaller tonnage press (molding machine) may be employed. As a result several smaller presses may be housed in the same space now used for the larger present day plastic encapsulation press of significantly greater tonnage. For example, conventional multi-cavity transfer molding machines used to encapsulate a plurality of integrated circuits at one time typically have a capacity of 100 to 150 tons. In contrast, a similar multi-cavity molding machine using the principles of this invention might require a press with a capacity of only 7 to 8 tons to encapsulate a like plurality of integrated circuits at one time. In addition, the failure of one or more cavities in a multi-cavity mold constructed in accordance with the principles of this invention need not render the entire mold useless. Operations may simply continue without the one damaged cavity being used. This is to be contrasted with multi-cavity molds used in conventional plastic transfer molding machines where a major defect in one cavity can render the entire mold less productive until the defect can be remedied.

As mentioned above, one of the disadvantages of the prior methods of producing plastic packages is the limited number of external leads which can be obtained in a package of given surface area dimensions. For example, the familiar DIP can accommodate lead frames having 14 to 28 leads in a package length and width that can be conveniently accommodated in most circuit board applications. It is physically possible, of course, to fabricate DIPS which have 30, 40, 50 or more leads.

The difficulty with such increases in the number of leads, however, is that the length and width of the package needed to accommodate the required lead frames increases dramatically, with the result that the DIP occupies too great an area on the circuit board and/or possesses a geometry that is inappropriate for the particular circuit board application. In addition, such increased package sizes also necessarily result in longer lead lengths which may cause unacceptably long electrical circuit paths.

Figure 8:
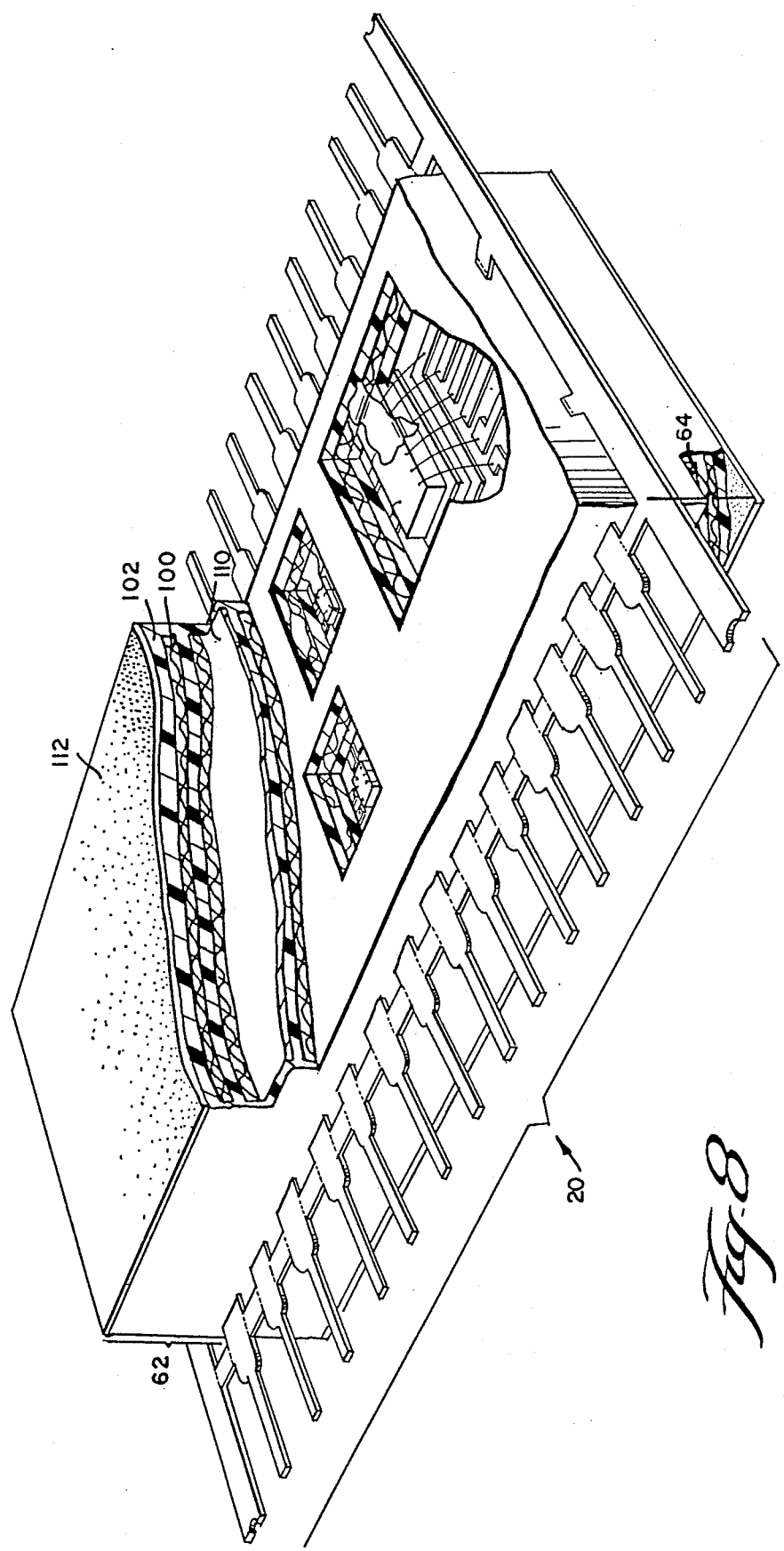
FIG. 8 is a perspective view similar to FIG. 1 but depicting an exemplary "hybrid" integrated circuit carrier embodiment.

FIG. 8 explicitly depicts a "hybrid" embodiment of the FIG. 1 and/or 6 type wherein plural integrated circuit chips or dice are accommodated by a corresponding array of "windows" in the upper stack 62 of prepreg sheets. Since such a "hybrid" embodiment is otherwise generally similar to the FIGS. 1 and/or 6 embodiments, no further detailed discussion is necessary.

If desired, the hybrid thick film pattern may be screened on a prepreg sheet with capacitors, resistors and the like conductively epoxy bonded to the thick film circuit. Alternatively, the pattern may be screened on a ceramic substrate or a lead frame can be used. IC chips are then wire bonded to in, L.C.C., etc. are then wire bonded to the exterior of the thick film circuit and this subassembly is then ready for laminated encapsulation as previously discussed.

By an alternative embodiment of the invention, I can overcome the foregoing disadvantages and provide a plastic encapsulation package with, for example, 50 or more leads which is not significantly larger in its surface area dimensions than an existing 28 lead DIP. Referring now to FIG. 6 of the drawings, there is shown a package similar to that of FIG. 1 (and like reference numerals have therefore been used to depict like parts), but different in that a pair of lead frames are utilized. The lead frames 20 and 20a are spaced apart vertically in parallel planes and insulated from each other by a third stack of one or more prepreg layers 150 located between the lead frames. The beam leads in each frame are preferably offset or interleaved horizontally between the location of leads in the other frame(s) to facilitate molding operations and also to facilitate appropriately spaced apart soldered beam connections on a printed circuit board 152. Each layer in this third stack is "windowed", as aforesaid, to allow bonding of the circuit lead wires prior to encapsulation, some of the lead wires from the circuit device being bonded to the inner ends of leads 106 of the lower frame 20 and the remaining bonded to the somewhat shorter and vertically offset inner ends of leads 106a of the other or upper frame 20a. The upper lead frame(s) 20a also do not include any central support area 118. The overall inner arrangement thus resembles a central patio area (in which device 22 is mounted) surrounded by a stair stepped region (on which the inner ends of leads from frame(s) 20a are exposed for connection).

In order to avoid a substantial change in the spacing between the lead frames during compression in the mold, which might stress or fracture the bonded lead wires, and also to facilitate handling, it is preferred that the layers 150 comprising the third stack (and perhaps the lowermost stack 64 as well) be compressed and partially pre-cured with the lead frames 20, 20a into a unitary mass prior to the mounting of the circuit device 22 and bonding of the lead wires 23, 23a. Alternatively, this pre-assembly might be "spot-welded" or spot glued together with a suitable adhesive to facilitate assembly without substantially activating the thermosetting epoxy resin and thus imposing time limits on the remainder of the assembly process. (Once activated, the epoxy curing reaction typically continues at a slow rate even in the absence of more heat/pressure and possibly absorbs moisture until in the fully cured state.) Thereafter, the topmost stack of prepreg layers 62 (and the bottom most 64 if not already pre-bonded thereto) can be added and the molding and encapsulation process completed in the usual way as described above for production of the FIG. 1 embodiment.

The method and mold utilized to form encapsulation packages containing more than one lead frame may generally be the same as that described above, except that the parting plane of the mold is preferably stepped (along the edges through which conductive beam leads extend) as shown in FIG. 7 to accommodate the different vertical elevations of the alternate beam leads emanating from one and then the other lead frame. (Additional lead frames would preferably be accommodated by providing added numbers of successively stepped levels to the mold parting plane as should now be apparent.)

After molding and curing is completed, the leads may be separated (i.e. "singularized") in the usual way and bent at right angles for later insertion into a circuit board or other type of socket or connector. If desired, the bend in the leads of one of the frames may occur further from the package body than is the case with respect to the leads of the other frame so that plural rows of connections 106, 106a are formed with appropriate row spacing between the ends of the leads, as shown in FIG. 6. This permits an optimum staggered two row arrangement of solder connections to a printed circuit board 152.

The two staggered arrays of lead frames 20, 20a in FIG. 6 are shown as exiting in two respective planes and as being bent along two respective horizontally-spaced bend lines to result in a staggered array of connection pins 106, 106a. Alternatively, since the center-to-center lead spacing at the outer edges of the radially extending leads is inherently increased over that at the inside window area, a single linear array of connection pins may also be realized by (a) making the beam lead widths at the outer portions sufficiently small and (b) using vertically aligned bend lines for the lead frames 20, 20a. It is also possible to include a pair of lead bends internal to the laminated package (for one or both of the lead frames 20, 2a) so as to cause all the beam leads to exit the package side wall in a common single plane.

A plug-in pin array of leads may also be conveniently provided (in lieu of or in addition to beam leads as depicted in FIG. 1) as shown in FIGS. 9 and 10. One way to achieve such a plug-in pin array (e.g., as is now sometimes used for gate arrays and/or VLSI circuits used with fine pitch leads or pins exceeding 100 in number), is to provide such pins 200 conventionally affixed to and depending downward from the radially extending conductive leads in frames 20, 20a. In this case the frames 20, 20a may be initially supported by a non-conductive substrates 202a, 202b and 202c (e.g., one or more at least partially cured prepreg sheets).

If desired, a subassembly of the frames 20, 20a and laminates 202a, 202b, 202c may be first formed in a separate lamination processed For example, prepreg 202a (with prestamped holes) may be placed in an appropriate mold (with pin receiving holes) and the pins 200 of frame 20 inserted therethrough. Then prepreg layer 202b is placed on top of frame 20 and the pins of frame 20a are inserted through both layers 202a and 202b into the lower mold plunger face. Thereafter prepreg layer 202c is placed on top, the mold is closed and layers 202a, 202b, 202c are laminated with frames 20, 20a to form a subassembly ready for chip placement and wire bonding. The resulting subassembly is then assembled as shown in FIG. 9 with other prepreg sheets and the process proceeds essentially as described with respect to FIG. 1.

Vertical (i.e., transverse conductive pins 200 are conventionally fitted into and bonded within respective holes in each radial lead of the horizontal planar array. Then the lower stack of prepreg sheets 64 (pre-drilled or punched with an array of holes to match the array of plug-in pins) is placed in the lower mold (or fitted over the pin array before the whole lower subassembly is lowered into the mold). The lower mold plunger 38 also includes an array of mated apertures to receive the distal ends of the plug-in pin array thereinto during the lamination process. As shown in FIGS. 9 and 10, plural horizontal planar arrays of conductor frames may be used (as in FIG. 6) to facilitate the use of large numbers of externally accessible connections. In short, the FIGS. 9 and 10 plug-in pin array embodiment is very similar to the FIG. 1 and/or FIG. 6 embodiments except for the following features:

(1) the horizontal planar array(s) of leads do not extend through the edges of the package but, rather, they terminate inside the package and are therefore totally encapsulated;

(2) instead, the distal ends of the overall lead array(s) are now provided by an array of vertical plug-in pins 200 which extend through the bottom side of the package;

(3) the lower stack 64 of prepreg includes an array of holes to accommodate the array of downwardly depending plug-in pins; and (4) the lower press plunger 38 also 15 includes an array of holes to accommodate the array of downwardly depending plug-in pins.

A subassembly of 0.025 inch center-to-center spaced apart external leads in a "quad-pak" configuration can be readily realized using this invention. (A "quad-pak" is typically a substantially square package having beam leads extending therefrom on each of its four sides.) Here two or more layers of lead frames may be utilized internally of the package where center-to-center lead spacing must reduce to only about 0.005–0.010 inch at the points where the IC chip is wire bonded to the plural tiers of leads similar to the FIG. 6 embodiment. As should now be realized, the internal tiers of leads could be placed in line one above the other or staggered. And, for a standard quad-pak, the external leads would, of course, exit the package in a single plane.

If desired, suitable decals may be included as desired in the outermost lamination layers and molded thereinto during the overall lamination of the package or, perhaps, even in a separate subsequent step.

Figure 11:
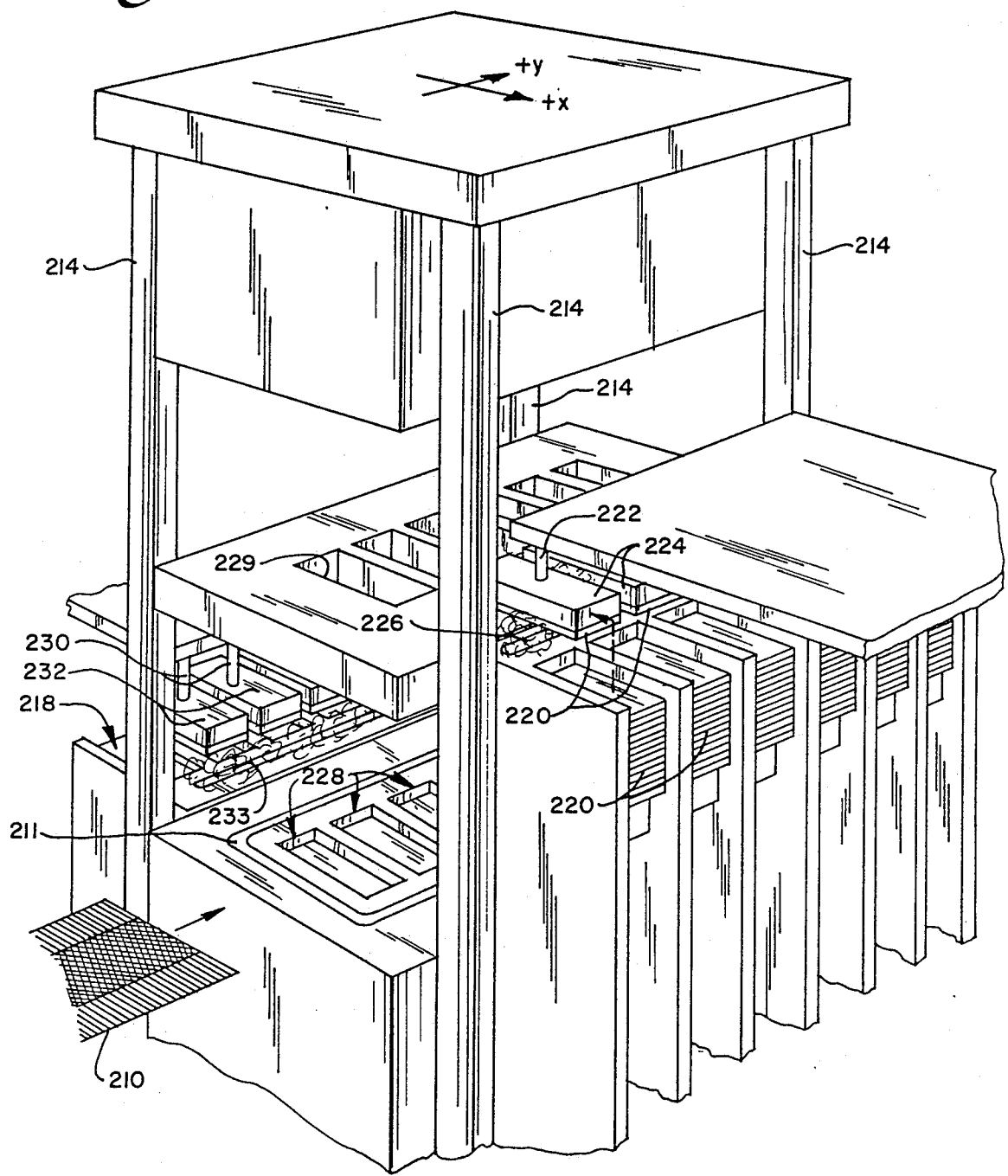
FIG. 11 is a schematic perspective view of an automated encapsulating apparatus formed in accordance with the present invention.
Figure 12:
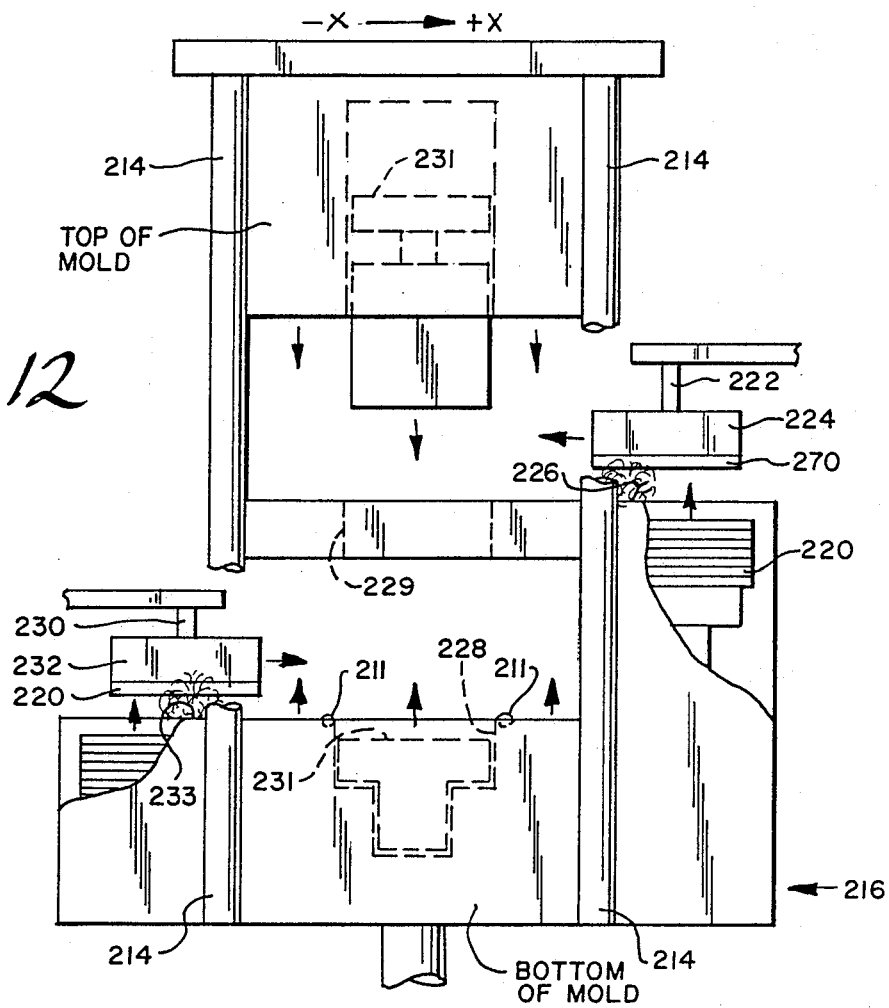
FIG. 12 is a schematic front view of the apparatus of FIG. 11.
Figure 13:
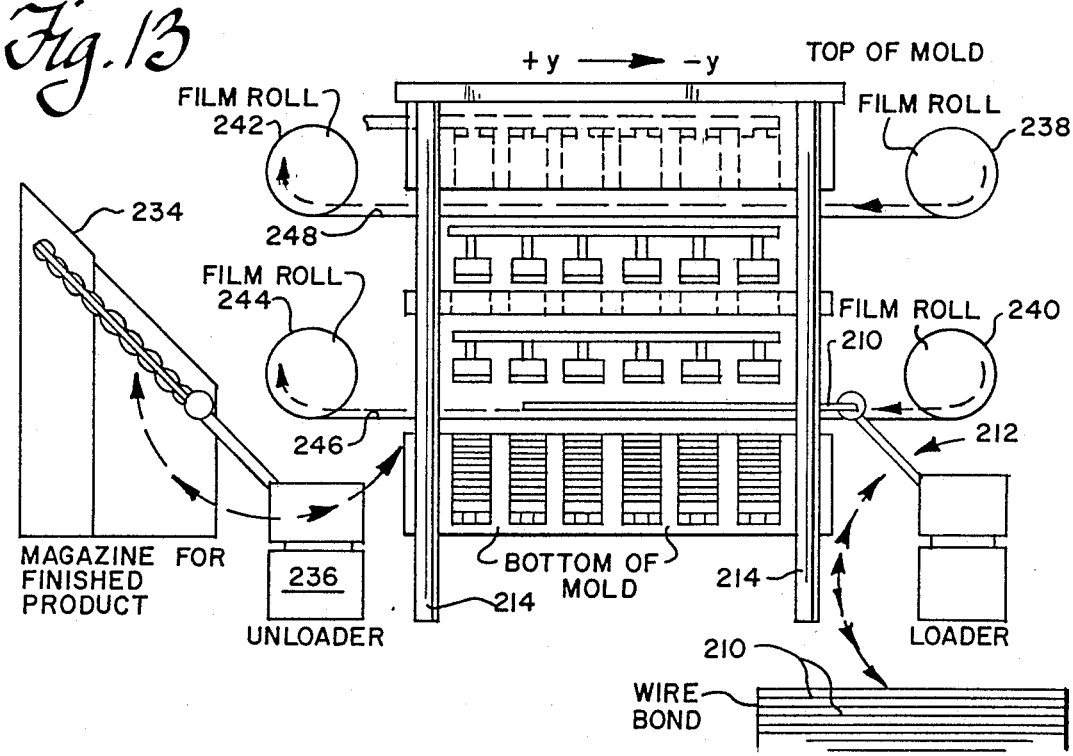
FIG. 13 is a schematic side view of the apparatus of FIG. 11 and further including sheets non-stick film for protecting the molding cavities of the apparatus.

In accordance with a further aspect of the present invention, an automated lamination/encapsulation molding apparatus and process are provided which will be described hereinafter with reference to FIGS. 11, 12 and 13.

In accordance with the automated process of the present invention, the conventional steps of conveying the chips to a magazine after the leads are bonded thereto where they are stacked on individual shelves, storing the magazines, and sending them to the molding department for encapsulation are eliminated. Instead, the lead frame 210 with the wire bonded chip goes to a feeder 212 that loads the lead frame directly into the mold.

More particularly, the molding press has four vertical tie rods 214 which hold the basic molding machine as a unit. If we describe the machine using X and Y axes, the X axis has two linear storage regions 216, 218 each having cut to size prepregs 220 in a line of six equally spaced stacks. Six arms 230 with one or more vacuum cups 232 on each arm 230 picks up six individual prepregs 220 and moves them over six matching hot air orifices 233 which blow hot air (250° F. to 600° F.) onto the bottom surface of the prepregs 220. The movement of arms 222 over orifices 226 is in the −X direction as shown.

The open mold has six independent plungers recessed to accept the preheated prepregs into the open bottom cavity (cavities) 228. The heated mold continues to preheat the entire prepreg 220. At this time, moving in the +Y position of the molding machine, the lead frame enroute from the wire bonder loads the wire bonded frame over the bottom cavities 228 onto positioning pins (not shown in FIG. 11).

While this is in process, on the other side of the machine, another set of equally spaced stacks of prepregs 220 is in position and another set of vacuum arms 232 with one or more vacuum cups 224 picks up a set of prepregs 220 and moves forward in the −X direction over another set of preheated air orifices 226 so as to preheat prepregs 220 and to help reduce the molding cycle. They are then loaded into top mold cavities 229, and the plunger of the vacuum cups 224 inserts them deep into the cavities for more uniform preheating. This also begins a process of activating the prepreg and releasing of gases and moisture.

This process up to now is being completed in 6-10 seconds. At this time the press closes and a complete vacuum system immediately draws off more gases and, more importantly, any moisture as it is boiled off. The entire mold and plungers are sealed off in this small vacuum chamber. A few seconds later, the upper and lower sets of six plungers 231 advance, the upper plunger at first advancing more rapidly so that the plungers are equally distant from each other. Then the plungers are advanced simultaneously in a precise movement to push the preheated prepregs together over the wire bonded chips and lead frame. The vacuum continues to draw moisture and gases from the cavities. At this stage, the mold can either breath or the mold can pause in its closing process with a separation between mold sections of one-thirty second of an inch, for example, to let moisture and gases escape. During this period, a silicon ring seal 211 in a groove around the mold halves will be sealed to allow the vacuum to draw off moisture and gases. Of course, the upper and lower mold bases and plunger systems must be sealed off to allow the vacuum to draw off contaminants.

The plungers compress the prepregs and bonds them together under heat and pressure. This continues for approximately 50 seconds. When the encapsulated prepregs are in the green state or partially or completely cured and rigid enough to be ejected, the mold opens. The ejector system and/or plungers on the bottom hold for a moment as the top plungers push them out of the upper cavities. Then the lower system raises the encapsulated lead frame ⅛ to ¼" above the lower cavities. The lead frame 210 is then unloaded and moved into an empty position of the magazine 234. An unloader 236 may be provided for this purpose on the +Y side of the machine. The unloader can enter and remove the encapsulated lead frame 210.

The cycle then repeats itself. The total cycle should be under 2 minutes if cure time requires such extra time. Ideally it should be completed in less than 60 seconds.

Further, while in the illustrated embodiment, six stacks of prepregs and six arms are provided on each side of the mold cavities, it is to be understood that the particular number of mold cavities, stacks of prepregs, and prepreg carrying arms is not to be limited to the illustrated embodiment. Indeed, the particular number of such elements will depend on the needs of the manufacturer. Further, while in the illustrated embodiment the hot air blowers are mounted to blow hot air towards the lower surface of the prepregs during transport thereof, it is to be understood that such hot air blowers could be provided to blow hot air toward the longitudinal ends of the prepregs, particularly where the prepreg is rolled instead of simply stacked.

With pretreated mold surfaces such as Teflon, dicronite, titanium nitrate, or chrome etc. the mold should not have to be cleaned after each shot. Should this be necessary, however, rotating brushes and a vacuum system (not shown) would remove any excess flash and debris or plastic from the molding surfaces.

Another option to eliminate the need to clean each shot after each molding cycle is to introduce a non-stick temperature resistant plastic sheeting into the mold. Teflon or other high temperature non-stick films would be suitable choices. As can be seen in FIG. 13, in one embodiment, two reels of plastic are provided at −Y, one on top 238 and one on the bottom 240 and two take up reels on +Y 242, 244. The film can be as thin as 0.0005 to 0.005 inches, strength and durability of course being a factor in the determination of an appropriate thickness. Recycling these rolls of plastic will help keep the cost down.

This process is very similar to the automated process discussed above, with the following modifications to the cycle. First, a non-stick film, high temperature resistant, with some minimal stretch characteristic, of 0.001 or less thickness and a width of about ¾" so as to extend about ¼" beyond the body of the I.C., on reels in the direction the lead frame is positioned in the mold as described above.

Laying in the mold flat over the bottom cavities 228 is a section of the non-stick film 246, prepreg preforms 220 are automatically placed into the cavities after they have been preheated and pressed down, stretching the film to the depth of cavities 228. The lead frame 210 is automatically loaded onto the positioning pins, which are seated above the cavities. The top preheated prepreg 220 is then automatically positioned on the lead frame 210. The upper non-stick film 248 is positioned over the upper cavities, reel 238 to reel 242. The mold is closed, the bottom mold moving up to position but leaving about 1/32" prior to closing. This initial movement compresses the silicon ring seals 211 surrounding the exterior surface of the mold and the preheated preforms continue releasing gases and moisture into the open mold area—but the reserve vacuum tank seal is opened so these gases and moisture drain off into the tank leaving the prepregs relatively free of trapped moisture or gases. Therefore, they have few pockets to jeopardize the future integrity of the I.C. package. The mold closes after a 3 or 4 second delay. At the time the cavity plungers are equally spaced from the lead frame 210, they simultaneously move, compressing the plastic prepreg in the upper and lower cavities. The non-stick film or tape 246, 248 helps keep the lead frame clean, but a major factor is the low flow characteristics of the plastic itself.

After the plastic is sufficiently cured to be ejected, the mold is opened. The ejector system (one may not be necessary) and the mold plungers push the molded I.C. out of cavities. The bottom plungers raise the lead frame sufficiently for an unloader to retrieve the lead frame 210 with encapsulated circuit devices. The film rewinds to the next position, or if undamaged can remain for one or more shots. The lead frames are stacked in awaiting magazines. In the alternative, the plungers push up the molded I.C. out of the cavities and the encapsulated circuits can be moved out of the machine by the winding of the non-stick film. The width of the teflon should not extend to overlap the locating pins, unless some other concept is used to locate lead frame, since this will reduce flash of plastic on the lead frame and it is indeed very important to keep plastic off the lead frame.

High lead count in multilayers are also practical with the automated encapsulation process. The Military requires a silver glass chip bonding technique that is done at temperatures in the 400° C. Also, the chips themselves are so large they can be seriously stressed if encapsulated with the standard molding process and multilayer ceramic packages can cost more than the chip itself.

The first step in accordance with the present invention is to bond the chip to a lower lead frame, which has numerous stamped protrusions on non-signal conducting portions such as on ground leads or exterior transfer ribbons supporting the central lead frame. A cutout layer of prepreg would be positioned between some of the protrusions, a second lead frame with matching holes would be fitted onto the bottom lead frame over the non cured prepreg so that they are stacked together. If there is any doubt as to their security, they can be soldered, spot welded, etc. In addition, a third lead frame can be assembled in a similar manner for very high lead counts. After the required number are assembled together they are wire bonded in the usual two or three tier bonding machines. Once wire bonded, they are loaded into the automated encapsulation machine and encapsulated in the manner described with reference to FIGS. 11 and 12 above, with or without a non-stick film.

Those in the art will appreciate that the lamination technique employed in this invention will readily lend itself to many other geometries wherein beam leads, conductive pads, plug-in pins and the like extend to or beyond the outer package edges for making external electric contacts.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A molding apparatus for producing an encapsulated electronic circuit device, said mold comprising:

an upper press member disposed above a lower press member, said upper and lower press members being relatively movable toward each other;

heated molding means disposed between said upper and lower press members and having at a parting plane thereof ledge means for holding at least one planar conductive lead frame therein and having upper and lower mold cavity means, and means for placing plural sheets of prepreg, a planar conductive lead frame, and plural sheets of prepreg, in that order, between said upper and lower mold cavity means.

2. A molding apparatus as in claim 1 wherein said molding means includes slot means for inserting said sheets of prepreg therethrough into at least one of said upper and lower mold cavity means after said lead frame is held therein.

3. A molding apparatus as in claim 1 wherein said molding means includes an upper portion and a lower portion each having a stepped end face for supporting between said upper portion and said lower portion the vertically spaced and horizontally offset leads of plural conductive lead frames.

4. A mold for use in producing an encapsulated electronic circuit device having plural planar arrays of conductive beam leads extending therefrom, said mold comprising:

an upper mold member having an end face which is stepped about at least a part of its periphery; and a lower mold member having an end face which is stepped about at least part of its periphery and mated with that of said upper mold member, said stepped end faces being spaced and dimensioned to simultaneously support plural planar arrays of conductive beam leads extending from an electronic circuit device during encapsulation thereof in said mold; and means for placing plural sheets of prepreg, a planar conductive lead frame, and plural sheets of prepreg, in that order, between said upper and lower mold members.

5. An apparatus for encapsulating an electronic circuit device comprising:

an upper mold defining an upper mold cavity;

a lower mold defining a lower mold cavity;

first holding means for holding fiber resin prepregs for deposition in said lower mold cavity;

first transporting means for transporting prepregs from said first holding means to a point intermediate said upper mold cavity and said lower mold cavity for placement in said lower mold cavity;

means for conveying electronic circuit devices to be encapsulated to a point intermediate said upper mold cavity and said lower mold cavity;

second holding means for holding fiber resin prepregs for placement on top of an electronic circuit device disposed intermediate said upper and lower mold cavities; and second transporting means for transporting prepregs from said second holding means to a point intermediate said upper mold cavity and said lower mold cavity for placement on an electronic circuit device to be encapsulated.

6. An apparatus as in claim 5, wherein said first transporting means and said second transporting means each comprise a plurality of arm elements coupled for movement relative to said first and second holding means and said upper and lower mold cavities and having at a second end thereof auction cup means for coupling said arms to said fiber resin prepregs to thereby transport said fiber resin prepregs from said first and second holding means to said mold cavities.

7. An apparatus as in claim 5, further comprising means for removing an encapsulated circuit device from said upper and lower mold cavities after encapsulation therein.

8. An apparatus as in claim 5, further comprising means for heating said fiber resin prepregs during transport from said first and second holding means, respectively to said point between said upper molding cavity and lower mold cavity.

9. An apparatus as in claim 8, wherein said means for heating comprise hot air blowers mounted intermediate said first holding means and said lower mold cavity and said second holding means and said lower mold cavity.

10. An apparatus as in claim 5, further comprising first and second rollers mounted for rotation on opposite ends of said molding cavities and a non-stick film material mounted to said rollers so as to extend between said upper mold cavity and said lower mold cavity.

11. An apparatus as in claim 10, wherein there are two sets of rollers to thereby provide two sheets of non-stick film extending between said upper and lower mold cavities to thereby prevent sticking of said encapsulated electronic device to said mold cavities.

12. An apparatus as in claim 5, wherein said first holding means and said second holding means each comprise a plurality of bins, each said bin holding a plurality of fiber resin prepregs.

13. An apparatus as in claim 12, wherein there are six bins for said first holding means and six bins for said second holding means.

14. An apparatus as in claim 12 further comprising hot air blowers heating said fiber resin prepregs during transport disposed intermediate each said plurality of bins and said lower mold cavity.

* * * * *